(12) United States Patent  (10) Patent No.: US 12,381,095 B2
Kohaku et al.  (45) Date of Patent: Aug. 5, 2025

(54) SUBFAB AREA INSTALLATION APPARATUS

(71) Applicants: EBARA CORPORATION, Tokyo (JP); EBARA REFRIGERATION EQUIPMENT & SYSTEMS CO., LTD., Tokyo (JP)

(72) Inventors: Motoshi Kohaku, Tokyo (JP); Yukihiro Fukusumi, Tokyo (JP); Nobutaka Bannai, Tokyo (JP); Hiromasa Miyata, Tokyo (JP); Naoya Hanafusa, Tokyo (JP); Ken Taoka, Tokyo (JP); Kazutomo Miyazaki, Tokyo (JP)

(73) Assignees: EBARA CORPORATION, Tokyo (JP); EBARA REFRIGERATION EQUIPMENT & SYSTEMS CO., LTD., Tokyo (JP)

( * ) Notice: Subject to any disclaimer, the term of this patent is extended or adjusted under 35 U.S.C. 154(b) by 755 days.

(21) Appl. No.: 17/743,874

(22) Filed: May 13, 2022

(65) Prior Publication Data

US 2023/0017834 A1  Jan. 19, 2023

(30) Foreign Application Priority Data

May 24, 2021  (JP) .................................. 2021-086744

(51) Int. Cl.
 *H01L 21/67* (2006.01)
(52) U.S. Cl.
 CPC .............................. *H01L 21/67069* (2013.01)
(58) Field of Classification Search
 CPC ........... H01L 21/6719; H01L 21/67069; H01L 21/67248; H01L 21/67017; H01L 21/67109; F25B 2500/18; F25B 2500/21
 See application file for complete search history.

(56) References Cited

U.S. PATENT DOCUMENTS

| | | | | |
|---|---|---|---|---|
| 9,631,810 | B2* | 4/2017 | Czerniak | F23G 7/065 |
| 2009/0222128 | A1* | 9/2009 | Clark | G05B 19/418 |
| | | | | 700/159 |
| 2017/0092471 | A1* | 3/2017 | Wakai | H01J 37/32724 |

FOREIGN PATENT DOCUMENTS

| | | |
|---|---|---|
| JP | 2006-313048 A | 11/2006 |
| JP | 2014-231822 A | 12/2014 |

(Continued)

OTHER PUBLICATIONS

Ishikawa et al. (WO2019188670A1) English Translation (Year: 2019).*

*Primary Examiner* — Elizabeth J Martin
*Assistant Examiner* — Keona Lauren Banks
(74) *Attorney, Agent, or Firm* — Leydig, Voit & Mayer, Ltd.

(57) ABSTRACT

A sub-fab area installation apparatus capable of reducing a power consumption used in manufacturing of semiconductors is disclosed. The sub-fab area installation apparatus includes: a vacuum pump configured to evacuate a processing gas from a processing chamber of the semiconductor manufacturing equipment; a cooling unit configured to cool a first circulation liquid used in the processing chamber; a heating unit configured to heat a second circulation liquid used in the processing chamber; an abatement device configured to detoxify the processing gas discharged from the vacuum pump; and a cooling-liquid line configured to pass a cooling liquid therethrough. The cooling liquid is supplied from a cooling source. The cooling-liquid line includes: a first downstream line, a second downstream line, and a third downstream line configured to supply the cooling liquid that has passed through the abatement device, the vacuum pump, and the cooling unit to the heating unit.

21 Claims, 18 Drawing Sheets

(56) References Cited

FOREIGN PATENT DOCUMENTS

| | | |
|---|---|---|
| JP | 2019-174050 A | 10/2019 |
| WO | WO 2002/067301 A1 | 8/2002 |
| WO | WO-2019188670 A1 * | 10/2019 |

* cited by examiner

SUBFAB AREA INSTALLATION APPARATUS

CROSS REFERENCE TO RELATED APPLICATION

This document claims priority to Japanese Patent Application No. 2021-086744 filed May 24, 2021, the entire contents of which are hereby incorporated by reference.

BACKGROUND

An etching equipment, arranged in a clean room, is used for a dry etching process which is one of semiconductor manufacturing processes. In a sub-fab area under a floor of the etching equipment, there are disposed several devices including an abatement device for detoxifying a processing gas used for etching, a vacuum pump for evacuating the processing gas from an etching chamber, and a cooling unit for cooling a circulation liquid flowing through the etching chamber, and a heating unit for heating the circulation liquid flowing through the etching chamber. Heating types of the heating unit include a type of heating the circulation liquid with a hot gas of a compression-type refrigeration machine, a type of heating the circulation liquid with an electric heater, and a type of heating the circulation liquid with both the hot gas and the heater. The abatement device, the vacuum pump, the cooling unit, and the heating unit are required to be cooled with cooling water (it is noted that the heating unit of electric heater type does not require the cooling water).

International patent publication No. WO 2002/067301 discloses an exhaust-heat utilization system that uses hot cooling water at 80° C. from a vertical heat-treatment equipment (i.e., a semiconductor-wafer heat treatment equipment) of a semiconductor manufacturing equipment as a heating source of an etching equipment.

Japanese laid-open patent publication No. 2019-174050 discloses an exhaust-heat recovery and reuse system that absorbs and uses exhaust heat from an abatement device with a heat pump. The exhaust gas is used as a heating source for a resin tower that purifies raw water in a water treatment facility in a semiconductor manufacturing facility and a reverse osmosis membrane equipment.

Japanese laid-open patent publication No. 2014-231822 discloses a system in a vacuum pump is integrated with an abatement unit to share cooling water.

Japanese laid-open patent publication No. 2006-313048 discloses an exhaust-heat utilization system in which a plurality of exhaust heat generating devices and a plurality of exhaust heat utilization devices are coupled by exhaust heat transfer paths.

As the number of etching equipment increases, the devices in the sub-fab area also increase. Since these devices are operated individually without transferring heat between these devices and are not optimized for the entire devices in the sub-fab area, the power consumption increases as the number of devices increases.

SUMMARY

Therefore, there is provided a sub-fab area installation apparatus capable of effectively utilizing an exhaust heat generated in a semiconductor manufacturing equipment and capable of reducing a power consumption used in manufacturing of semiconductors.

Embodiments, which will be described below, relate to a sub-fab area installation apparatus used for a semiconductor manufacturing equipment, such as an etching equipment, and more particularly to a sub-fab installation apparatus for cooling and heating a circulation liquid used in a semiconductor manufacturing equipment.

In an embodiment, there is provided a sub-fab area installation apparatus used for a semiconductor manufacturing equipment, comprising: a vacuum pump configured to evacuate a processing gas from a processing chamber of the semiconductor manufacturing equipment; a cooling unit configured to cool a first circulation liquid used in the processing chamber; a heating unit configured to heat a second circulation liquid used in the processing chamber; an abatement device configured to detoxify the processing gas discharged from the vacuum pump; and a cooling-liquid line configured to pass a cooling liquid therethrough, the cooling liquid being supplied from a cooling source, wherein the cooling unit includes a first heat pump through which a refrigerant circulates, the heating unit includes a second heat pump through which a refrigerant circulates, and the cooling-liquid line includes: a first upstream line, a second upstream line, and a third upstream line configured to supply the cooling liquid to the abatement device, the vacuum pump, and the cooling unit, respectively; a first downstream line, a second downstream line, and a third downstream line configured to supply the cooling liquid that has passed through the abatement device, the vacuum pump, and the cooling unit to the heating unit; and a cooling-liquid return line configured to return the cooling liquid that has passed through the heating unit to the cooling source.

According to the above-described embodiment, the cooling liquid that has been heated when passing through the abatement device, the vacuum pump, and the cooling unit can be used as a heat source in the heating unit. Therefore, an electric equipment, such as an electric heater, is unnecessary, or a capacity of the electric equipment can be reduced. Furthermore, the cooling liquid that has been cooled when passing through the heating unit is returned to the cooling source, so that the electric power required for the cooling source (for example, a chiller installed in a factory of the semiconductor manufacturing equipment) to cool the cooling liquid again can be reduced. As a result, the power consumption used in manufacturing of the semiconductors can be reduced.

In an embodiment, the first downstream line, the second downstream line, and the third downstream line merge to form a merging line that extends to the heating unit, and the cooling-liquid line further includes a bypass line branching off from the merging line and coupled to the cooling-liquid return line.

In an embodiment, the sub-fab area installation apparatus further comprises: a first flow-rate control valve, a second flow-rate control valve, and a third flow-rate control valve provided in the first upstream line or the first downstream line, the second upstream line or the second downstream line, and the third upstream line or the third downstream line, respectively; a first temperature-measuring device, a second temperature-measuring device, and a third temperature-measuring device configured to measure temperature of the cooling liquid flowing through the first downstream line, the second downstream line, and the third downstream line; a heating-unit flow-rate control valve provided in the merging line, or the cooling-liquid return line, or the bypass line; a heating-unit flow-rate measuring device configured to measure a flow rate of the cooling liquid flowing through the heating unit, the heating-unit flow-rate measuring device being provided in the merging line or the cooling-liquid return line; and a valve controller configured to control operations of the third flow-rate control valve, the second flow-rate control valve, and the third flow-rate control valve such that temperatures of the cooling liquid flowing through the first downstream line, the second downstream line, and the third downstream line are constant, the valve controller being further configured to control operation of the heating-unit flow-rate control valve such that the flow rate of the cooling liquid flowing through the heating unit is constant.

According to the above-described embodiment, the temperature and the flow rate of the cooling liquid flowing through the heating unit are kept constant, and as a result, the heating unit can stably heat the second circulation liquid.

In an embodiment, the sub-fab area installation apparatus further comprises: a return-temperature measuring device configured to measure the temperature of the cooling liquid flowing through the cooling-liquid return line; and a heat pump controller configured to control operation of the second heat pump of the heating unit such that the temperature of the cooling liquid flowing through the cooling-liquid return line is maintained at not less than a set value.

The above-described embodiment can make it possible to prevent the temperature of the cooling liquid to be returned to the cooling source from dropping too low.

In an embodiment, the sub-fab area installation apparatus further comprises a buffer tank coupled to the first downstream line, the second downstream line, and the third downstream line.

According to the above-described embodiment, the cooling liquid that has been heated when passing through the abatement device, the vacuum pump, and the cooling unit is temporarily stored in the buffer tank before being supplied to the heating unit. The buffer tank can reduce a fluctuation in the temperature of the heated cooling liquid and can stabilize the flow rate of the cooling liquid supplied to the heating unit.

In an embodiment, the first downstream line, the second downstream line, and the third downstream line merge to form a merging line that extends to the heating unit, and the cooling-liquid line further includes a reheating line branching off from the merging line, the reheating line extending from the merging line to the first upstream line.

According to the above-described embodiment, when the cooling liquid in the buffer tank does not have a temperature high enough to serve as a driving heat source for heating the second circulation liquid flowing through the heating unit, the cooling liquid is returned to the abatement device and can be heated again.

In an embodiment, the cooling-liquid line further includes a bypass line branching off from the merging line and coupled to the cooling-liquid return line, the sub-fab area installation apparatus further comprises: an in-tank temperature measuring device configured to measure the temperature of the cooling liquid in the buffer tank; a reheating flow-rate control valve attached to the reheating line; a heating-unit flow-rate control valve provided in the bypass line, or the merging line, or the cooling-liquid return line; and a valve controller configured to control operations of the reheating flow-rate control valve and the heating-unit flow-rate control valve when the temperature of the cooling liquid in the buffer tank is equal to or lower than a set value such that the flow rate of the cooling liquid flowing through the reheating line has a predetermined value.

According to the above-described embodiment, when the cooling liquid in the buffer tank does not have a temperature high enough to serve as a driving heat source for heating the second circulation liquid flowing through the heating unit, the cooling liquid is returned to the abatement device and can be heated again.

In an embodiment, the cooling-liquid line further includes a second reheating line branching off from the second downstream line and a third reheating line branching off from the third downstream line, the second reheating line and the third reheating line being coupled to the first upstream line via a pressurizing pump.

According to the above-described embodiment, when the cooling liquid that has passed through the vacuum pump and the cooling unit does not have a temperature high enough to serve as a driving heat source for heating the second circulation liquid flowing through the heating unit, the cooling liquid is returned to the abatement device and can be heated again.

In an embodiment, the sub-fab area installation apparatus further comprises: a second downstream flow-rate control valve provided in the second downstream line at a position downstream of a branch point between the second downstream line and the second reheating line; a third downstream flow-rate control valve provided in the third downstream line at a position downstream of a branch point between the third downstream line and the third reheating line; a second temperature-measuring device and a third temperature-measuring device configured to measure the temperature of the cooling liquid flowing through the second downstream line and the third downstream line; a second reheating flow-rate control valve and a third reheating flow-rate control valve provided in the second reheating line and the third reheating line, respectively; and a valve controller configured to: reduce an opening degree of the second downstream flow-rate control valve and increase an opening degree of the second reheating flow-rate control valve when the temperature of the cooling liquid flowing through the second downstream line is lower than a threshold value; and reduce an opening degree of the third downstream flow-rate control valve and increase an opening degree of the third reheating flow-rate control valve when the temperature of the cooling liquid flowing through the third downstream line is lower than a threshold value.

According to the above-described embodiment, when the cooling liquid that has passed through the vacuum pump and the cooling unit does not have a temperature high enough to serve as a driving heat source for heating the second circulation liquid flowing through the heating unit, the cooling liquid is returned to the abatement device and can be heated again.

In an embodiment, the sub-fab area installation apparatus further comprises: a first downstream flow-rate control valve provided in the first downstream line; and a heating-unit flow-rate measuring device configured to measure the flow rate of the cooling liquid flowing through the heating unit, wherein the valve controller is further configured to control operation of the first downstream flow-rate control valve such that the flow rate of the cooling liquid flowing through the heating unit is constant.

According to the above-described embodiment, since the flow rate of the cooling liquid flowing through the heating unit is kept constant, the heating unit can stably heat the second circulation liquid.

In an embodiment, the cooling-liquid line further includes a second return line branching off from the second downstream line and a third return line branching off from the third downstream line, the second return line and the third return line being coupled to the cooling-liquid return line.

According to the above-described embodiment, when the cooling liquid that has passed through the vacuum pump and the cooling unit does not have a temperature high enough to serve as a driving heat source for heating the second circulation liquid flowing through the heating unit, the cooling liquid is returned to the cooling source instead of supplying to the heating unit, whereby the heating function of the heating unit can be maintained.

In an embodiment, the sub-fab area installation apparatus further comprises: a first downstream flow-rate control valve provided in the first downstream line; a second downstream flow-rate control valve provided in the second downstream line at a position downstream of a branch point between the second downstream line and the second return line; a third downstream flow-rate control valve provided in the third downstream line at a position downstream of a branch point between the third downstream line and the third return line; a second temperature-measuring device and a third temperature-measuring device configured to measure the temperature of the cooling liquid flowing through the second downstream line and the third downstream line; a second return flow-rate control valve and a third return flow-rate control valve provided in the second return line and the third return line, respectively; a heating-unit flow-rate measuring device configured to measure the flow rate of the cooling liquid flowing through the heating unit; and a valve controller configured to: reduce an opening degree of the second downstream flow-rate control valve and increase an opening degree of the second return flow-rate control valve when the temperature of the cooling liquid flowing through the second downstream line is lower than a threshold value; reduce an opening degree of the third downstream flow-rate control valve and increase an opening degree of the third return flow-rate control valve when the temperature of the cooling liquid flowing through the third downstream line is lower than a threshold value; and control operation of the first downstream flow-rate control valve such that the flow rate of the cooling liquid flowing through the heating unit is constant.

According to the above-described embodiment, when the cooling liquid that has passed through at least one of the vacuum pump and the cooling unit does not have a temperature high enough to serve as a driving heat source for heating the second circulation liquid flowing through the heating unit, the cooling liquid is returned to the cooling source instead of supplying to the heating unit, whereby the heating function of the heating unit can be maintained.

In an embodiment, the first downstream line, the second downstream line, and the third downstream line merge to form a merging line that extends to the heating unit, the cooling-liquid line further includes a bypass line branching off from the merging line and coupled to the cooling-liquid return line, the sub-fab area installation apparatus further comprises: a second downstream flow-rate control valve provided in the second downstream line at a position downstream of a branch point between the second downstream line and the second return line; a third downstream flow-rate control valve provided in the third downstream line at a position downstream of a branch point between the third downstream line and the third return line; a second temperature-measuring device and a third temperature-measuring device configured to measure the temperature of the cooling liquid flowing through the second downstream line and the third downstream line; a second return flow-rate control valve and a third return flow-rate control valve provided in the second return line and the third return line, respectively; a heating-unit flow-rate measuring device configured to measure the flow rate of the cooling liquid flowing through the heating unit; a heating-unit flow-rate control valve provided in the merging line, the cooling-liquid return line, or the bypass line; and a valve controller configured to: reduce an opening degree of the second downstream flow-rate control valve and increase an opening degree of the second return flow-rate control valve when the temperature of the cooling liquid flowing through the second downstream line is lower than a threshold value; reduce an opening degree of the third downstream flow-rate control valve and increase an opening degree of the third return flow-rate control valve when the temperature of the cooling liquid flowing through the third downstream line is lower than a threshold value; and control operation of the heating-unit flow-rate control valve such that the flow rate of the cooling liquid flowing through the heating unit is constant.

According to the above-described embodiment, when the cooling liquid that has passed through at least one of the vacuum pump and the cooling unit does not have a temperature high enough to serve as a driving heat source for heating the second circulation liquid flowing through the heating unit, the cooling liquid is returned to the cooling source instead of supplying to the heating unit, whereby the heating function of the heating unit can be maintained.

In an embodiment, the cooling-liquid line further includes a second return reheating line branching off from the second return line and a third return reheating line branching off from the third return line, the second return reheating line and the third return reheating line being coupled to the first upstream line via a pressurizing pump.

According to the above-described embodiment, when the cooling liquid that has passed through the vacuum pump and the cooling unit does not have a temperature high enough to serve as a driving heat source for heating the second circulation liquid flowing through the heating unit, the cooling liquid is returned to the cooling source, or returned to the abatement device and can be heated again.

In an embodiment, the sub-fab area installation apparatus further comprises: a second return-line temperature measuring device configured to measure the temperature of the cooling liquid flowing through the second return line at a position upstream of the second return reheating line; a second return flow-rate control valve and a third return flow-rate control valve provided in the second return line and the third return line, respectively; a third return-line temperature measuring device configured to measure the temperature of the cooling liquid flowing through the third return line at a position upstream of the third return reheating line; a second return reheating flow-rate control valve and a third return reheating flow-rate control valve provided in the second return reheating line and the third return reheating line, respectively; and a valve controller configured to control operations of the second return flow-rate control valve, the third return flow-rate control valve, the second return reheating flow-rate control valve, and the third return reheating flow-rate control valve.

According to the above-described embodiment, adjusting the flow rate of the control valve according to the temperature of the cooling liquid can make it possible to highly utilize the cooling source, such as a chiller, and the heating unit.

In an embodiment, the valve controller is configured to: increase an opening degree of the second return flow-rate control valve and reduce an opening degree of the second return reheating flow-rate control valve when the temperature of the cooling liquid flowing through the second downstream line is lower than a threshold value; and increase an opening degree of the third return flow-rate control valve and reduce an opening degree of the third return reheating flow-rate control valve when the temperature of the cooling liquid flowing through the third downstream line is lower than a threshold value.

In an embodiment, the valve controller is configured to control the operations of the second return flow-rate control valve, the third return flow-rate control valve, the second return reheating flow-rate control valve, and the third return reheating flow-rate control valve according to a command signal from the semiconductor manufacturing equipment.

In an embodiment, the second return line and the third return line merge to form a merging return line, the merging return line is coupled to the cooling-liquid return line, the cooling-liquid line further includes a merging reheating line branching off from the merging return line, and the merging reheating line is coupled to the first upstream line via a pressurizing pump.

According to the above-described embodiment, when the cooling liquid that has passed through the vacuum pump and the cooling unit does not have a temperature high enough to serve as a driving heat source for heating the second circulation liquid flowing through the heating unit, the cooling liquid is returned to the cooling source, or returned to the abatement device and can be heated again.

In an embodiment, the sub-fab area installation apparatus further comprises: a merging return-temperature measuring device configured to measure the temperature of the cooling liquid flowing through the merging return line; a merging return flow-rate control valve provided in the merging return line at a position downstream of a branch point of the merging reheating line from the merging return line; a merging reheating flow-rate control valve provided in the merging reheating line; and a valve controller configured to control operations of the merging return flow-rate control valve and the merging reheating flow-rate control valve.

In an embodiment, the valve controller is configured to increase an opening degree of the merging return flow-rate control valve and reduce an opening degree of the merging reheating flow-rate control valve when the temperature of the cooling liquid flowing through the merging return line is lower than a set value.

In an embodiment, the valve controller is configured to control the operations of the merging return flow-rate control valve and the merging reheating flow-rate control valve according to a command signal from the semiconductor manufacturing equipment.

According to the above-described embodiments, the power consumption used in manufacturing of semiconductors can be reduced. In particular, the electric power used for the heating unit can be reduced. Furthermore, the electric power of the cooling source, such as a chiller, for supplying the cooling liquid can be reduced.

DESCRIPTION OF EMBODIMENTS

Hereinafter, embodiments will be described with reference to the drawings.

Figure 1:
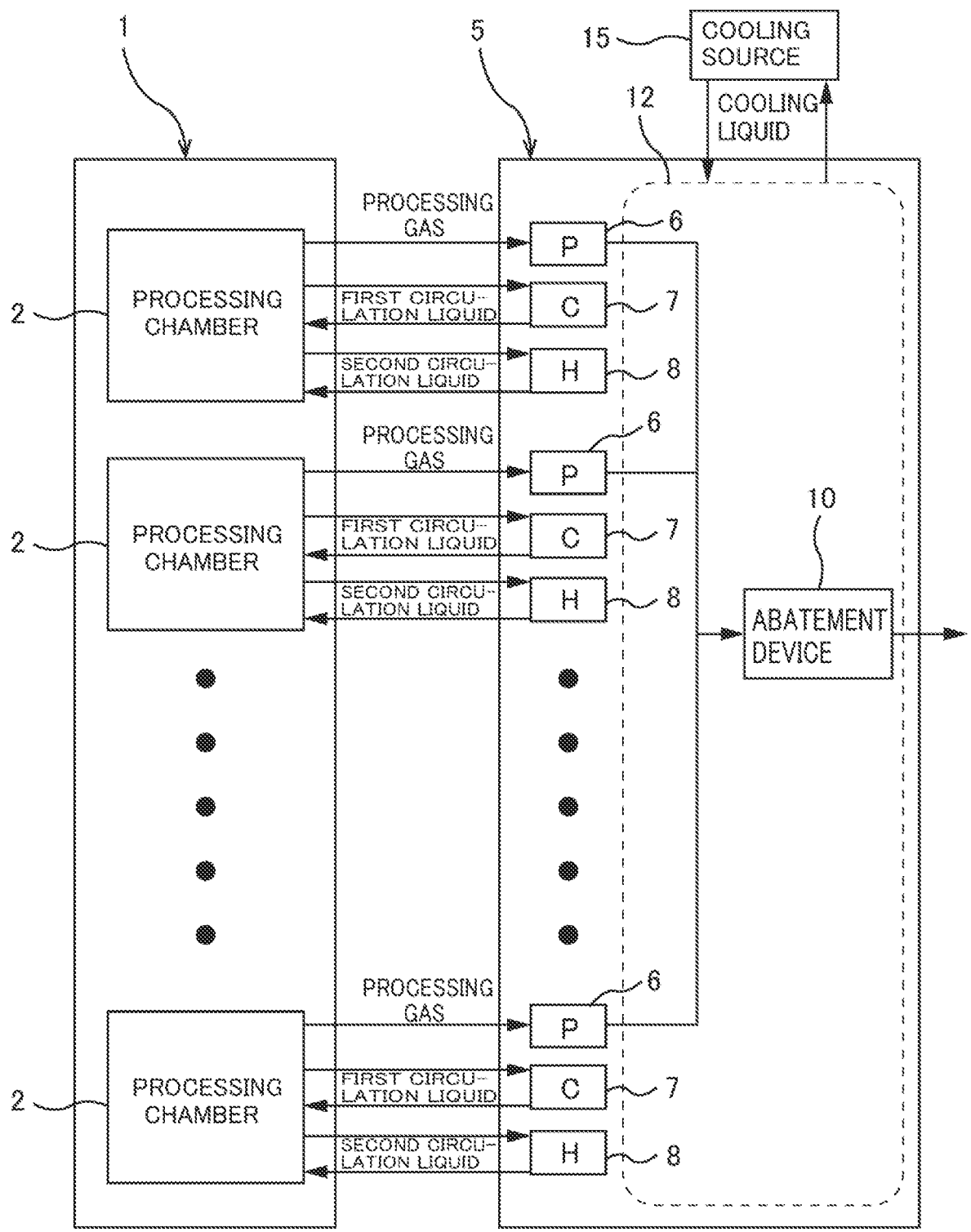
FIG. 1 is a schematic diagram showing an embodiment of a semiconductor manufacturing equipment and a sub-fab area installation apparatus.

FIG. 1 is a schematic diagram showing an embodiment of a semiconductor manufacturing equipment and a sub-fab area installation apparatus. A semiconductor manufacturing equipment 1 of the embodiment shown in FIG. 1 is an etching equipment including a plurality of processing chambers 2. The sub-fab area installation apparatus 5 is coupled to the plurality of processing chambers 2, and a first circulation liquid and a second circulation liquid circulate between the plurality of processing chambers 2 and the sub-fab area installation apparatus 5.

The sub-fab area installation apparatus 5 includes vacuum pumps 6 for evacuating processing gas (for example, etching gas) from the processing chambers 2, cooling units 7 for cooling the first circulation liquid that has been used in the processing chambers 2, heating units 8 for heating the second circulation liquid that has been used in the processing chambers 2, an abatement device 10 for detoxifying the processing gas discharged from the vacuum pumps 6, and a cooling-liquid line 12 through which a cooling liquid, supplied from a cooling source 15, flows. The cooling-liquid line 12 is schematically shown in FIG. 1. In the embodiment shown in FIG. 1, the plurality of processing chambers 2 are coupled to the plurality of vacuum pumps 6, the plurality of cooling units 7, and the plurality of heating units 8, while the single abatement device 10 is provided. A plurality of abatement devices 10 may be provided.

The number of processing chambers 2, the number of vacuum pumps 6, the number of cooling units 7, and the number of heating units 8 are not limited to the embodiment shown in FIG. 1. In embodiments described below, for simplifying the descriptions, the sub-fab area installation apparatus 5 includes one vacuum pump 6, one cooling unit 7, and one heating unit 8, each of which is coupled to one processing chamber 2. However, the configuration of the sub-fab area installation apparatus 5, particularly the number of vacuum pump 6, the number of cooling unit 7, and the number of heating unit 8, are not limited to the embodiments described below.

Figure 2:
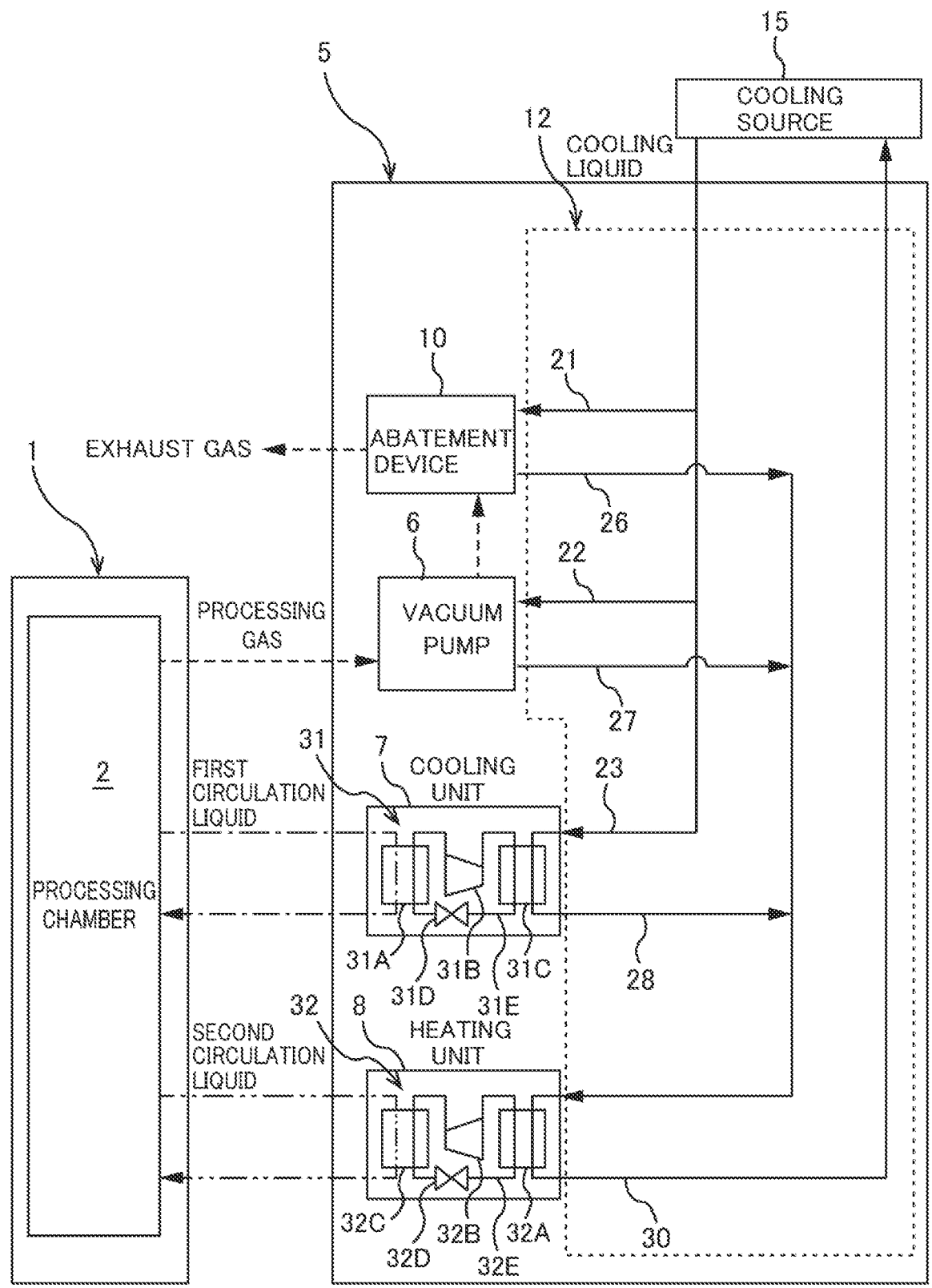
FIG. 2 is a schematic diagram showing an embodiment of a sub-fab area installation apparatus.

FIG. 2 is a schematic diagram showing an embodiment of the sub-fab area installation apparatus 5. As shown in FIG. 2, the sub-fab area installation apparatus 5 includes the vacuum pump 6 configured to evacuate the processing gas from the processing chamber 2, the cooling unit 7 configured to cool the first circulation liquid used in the processing chamber 2, the heating unit 8 configured to heat the second circulation liquid used in the processing chamber 2, the abatement device 10 configured to detoxify the processing gas discharged from the vacuum pump 6, and the cooling-liquid line 12 configured to pass the cooling liquid therethrough. This cooling liquid is supplied from the cooling source 15. The vacuum pump 6, the cooling unit 7, and the heating unit 8 are coupled to the processing chamber 2.

A suction port of the vacuum pump 6 is coupled to the processing chamber 2, and an exhaust port of the vacuum pump 6 is coupled to the abatement device 10. The type of the vacuum pump 6 is not particularly limited, and examples of the vacuum pump 6 include a positive displacement dry vacuum pump. Examples of the abatement device 10 include a wet abatement device, a catalytic abatement device, a combustion abatement device, a heater abatement device, and a plasma abatement device.

The cooling liquid is supplied to the abatement device 10, the vacuum pump 6 and the cooling unit 7 from the cooling source 15 through the cooling-liquid line 12. The cooling source 15 may be a chiller provided in a factory where the semiconductor manufacturing equipment 1 is installed. The cooling-liquid line 12 includes a first upstream line 21, a second upstream line 22, and a third upstream line 23 arranged to supply the cooling liquid to the abatement device 10, the vacuum pump 6, and the cooling unit 7, respectively. The cooling-liquid line 12 further includes a first downstream line 26, a second downstream line 27, and a third downstream line 28 arranged to supply the cooling liquid that has passed through the abatement device 10, the vacuum pump 6, and the cooling unit 7 to the heating unit 8. The cooling-liquid line 12 further includes a cooling-liquid return line 30 arranged to return the cooling liquid that has passed through the heating unit 8 to the cooling source 15.

The first upstream line 21 extends from the cooling source 15 to the abatement device 10, and the first downstream line 26 extends from the abatement device 10 to the heating unit 8. The cooling liquid is supplied from the cooling source 15 to the abatement device 10 through the first upstream line 21 to cool the abatement device 10. The cooling liquid that has passed through the abatement device 10 flows to the heating unit 8 through the first downstream line 26.

The second upstream line 22 extends from the cooling source 15 to the vacuum pump 6, and the second downstream line 27 extends from the vacuum pump 6 to the heating unit 8. The cooling liquid is supplied from the cooling source 15 to the vacuum pump 6 through the second upstream line 22 to cool the vacuum pump 6. The cooling liquid that has passed through the vacuum pump 6 flows to the heating unit 8 through the second downstream line 27.

The third upstream line 23 extends from the cooling source 15 to the cooling unit 7, and the third downstream line 28 extends from the cooling unit 7 to the heating unit 8. The cooling liquid is supplied from the cooling source 15 to the cooling unit 7 through the third upstream line 23 to cool the cooling unit 7. The cooling liquid that has passed through the cooling unit 7 flows to the heating unit 8 through the third downstream line 28.

The configurations of the first upstream line 21, the second upstream line 22, and the third upstream line 23 are not limited particularly as long as the above-mentioned functions can be provided. For example, the first upstream line 21, the second upstream line 22, and the third upstream line 23 may have a structure branching from one line into three lines, or may have three independent lines. Similarly, the configurations of the first downstream line 26, the second downstream line 27, and the third downstream line 28 are not limited particularly as long as the above-mentioned functions can be provided. For example, the first downstream line 26, the second downstream line 27, and the third downstream line 28 may be configured such that three lines merge into one line, or may be independent three lines.

The cooling unit 7 includes a first heat pump 31 in which a refrigerant circulates. The first heat pump 31 is a refrigeration machine (for example, a vapor compression refrigeration machine). Specifically, the first heat pump 31 includes a first evaporator 31A configured to evaporate a refrigerant liquid to produce a refrigerant gas, a first compressor 31B configured to compress the refrigerant gas, a first condenser 31C configured to condense the compressed refrigerant gas to produce the refrigerant liquid, and a first expansion valve 31D arranged between the first evaporator 31A and the first condenser 31C. The refrigerant flows through a first refrigerant pipe 31E to circulate through the first evaporator 31A, the first compressor 31B, the first condenser 31C, and the first expansion valve 31D. The processing chamber 2 is coupled to the first evaporator 31A, and the first circulation liquid circulates between the processing chamber 2 and the first evaporator 31A.

The third upstream line 23 and the third downstream line 28 are coupled to the first condenser 31C. The cooling liquid supplied from the cooling source 15 is delivered into the first condenser 31C through the third upstream line 23, and exchanges heat with the refrigerant gas in the first condenser 31C. As a result of the heat exchange between the cooling liquid and the refrigerant gas, the cooling liquid is heated, while the refrigerant gas is cooled into the refrigerant liquid. The refrigerant liquid is delivered to the first evaporator 31A through the first expansion valve 31D. The first circulation liquid is delivered to the first evaporator 31A and exchanges heat with the refrigerant liquid in the first evaporator 31A. As a result of the heat exchange between the first circulation liquid and the refrigerant liquid, the first circulation liquid is cooled, while the refrigerant liquid is heated into the refrigerant gas. The refrigerant gas is sucked into the first compressor 31B and compressed by the first compressor 31B. The compressed refrigerant gas is delivered to the first condenser 31C. In this way, the first circulation liquid is cooled by the cooling liquid via the refrigerant.

The heating unit 8 includes a second heat pump 32 in which the refrigerant circulates. The second heat pump 32 is a refrigeration machine (for example, a vapor compression refrigeration machine). Specifically, the second heat pump 32 includes a second evaporator 32A configured to evaporate a refrigerant liquid to produce a refrigerant gas, a second compressor 32B configured to compress the refrigerant gas, a second condenser 32C configured to condense the compressed refrigerant gas to produce the refrigerant liquid, and a second expansion valve 32D arranged between the second evaporator 32A and the second condenser 32C. The refrigerant flows through a second refrigerant pipe 32E to circulate through the second evaporator 32A, the second compressor 32B, the second condenser 32C, and the second expansion valve 32D. The processing chamber 2 is coupled to the second condenser 32C, and the second circulation liquid circulates between the processing chamber 2 and the second condenser 32C.

The first downstream line 26, the second downstream line 27, the third downstream line 28, and the cooling-liquid return line 30 are coupled to the second evaporator 32A. The cooling liquid whose temperature has risen by passing through the abatement device 10, the vacuum pump 6, and the cooling unit 7 is delivered into the second evaporator 32A through the first downstream line 26, the second downstream line 27, and the third downstream line 28, and exchanges heat with the refrigerant liquid in the second evaporator 32A. As a result of the heat exchange between the cooling liquid and the refrigerant liquid, the cooling liquid is cooled, while the refrigerant liquid is heated into the refrigerant gas. The refrigerant gas is sucked into the second compressor 32B and compressed by the second compressor 32B. The compressed refrigerant gas is delivered to the second condenser 32C. The cooling liquid that has passed through the second evaporator 32A is returned to the cooling source 15 through the cooling-liquid return line 30. The second circulating liquid is delivered to the second condenser 32C and exchanges heat with the refrigerant gas in the second condenser 32C. As a result of the heat exchange between the second circulation liquid and the refrigerant gas, the second circulation liquid is heated, while the refrigerant gas is cooled into the refrigerant liquid. The refrigerant liquid is delivered to the second evaporator 32A through the second expansion valve 32D. In this way, the second circulation liquid is heated by the cooling liquid via the refrigerant.

According to the present embodiment, the cooling liquid that has been heated when passing through the abatement device 10, the vacuum pump 6, and the cooling unit 7 can be used as a heat source in the heating unit 8. Therefore, an electric equipment, such as an electric heater, is unnecessary, or a capacity of the electric equipment can be reduced. Furthermore, the cooling liquid that has been cooled when passing through the heating unit 8 is returned to the cooling source 15, so that the electric power required for the cooling source 15 (for example, a chiller installed in a factory of the semiconductor manufacturing equipment 1) to cool the cooling liquid again can be reduced. As a result, the power consumption used in manufacturing of the semiconductors can be reduced.

Figure 3:
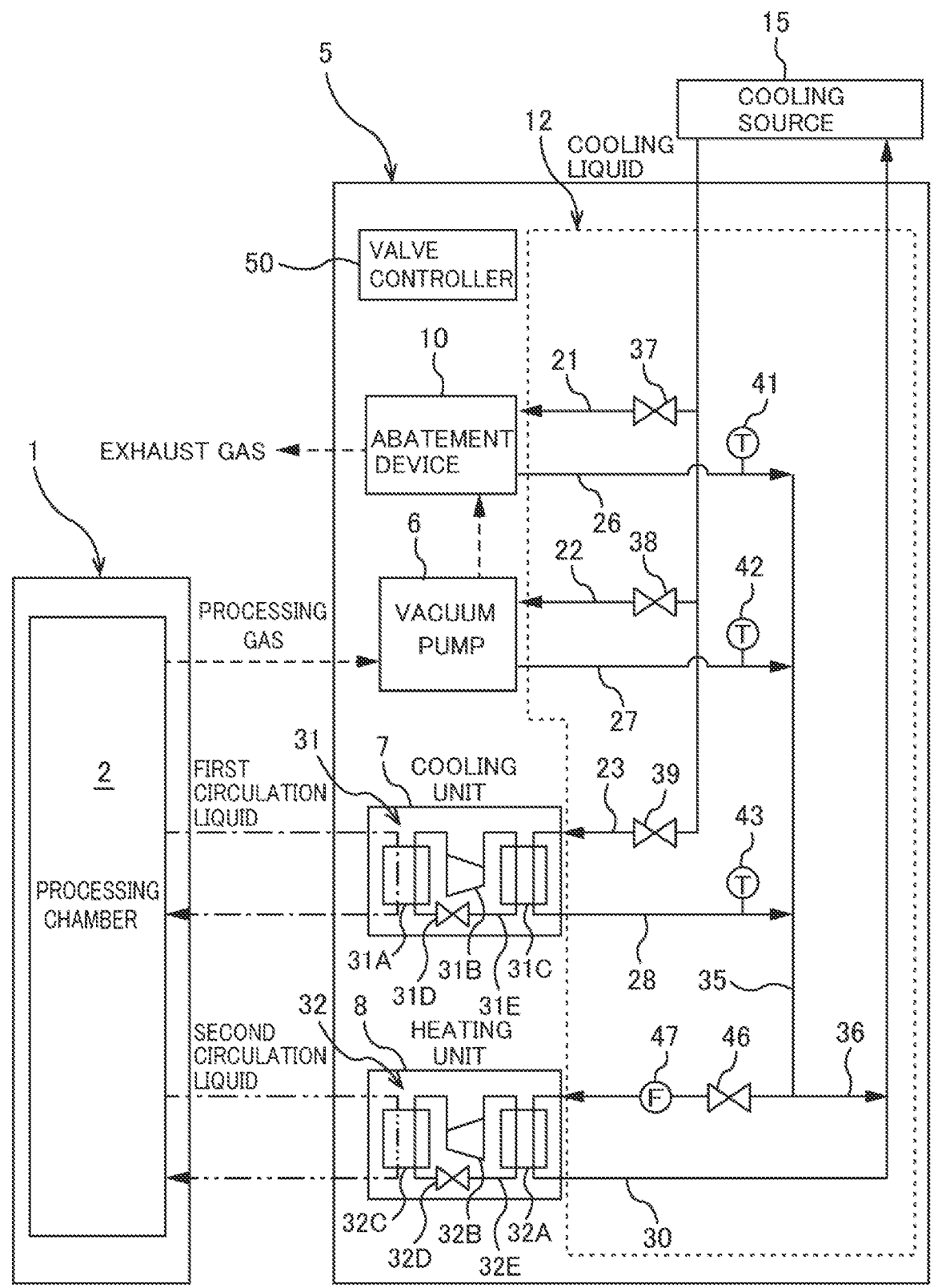
FIG. 3 is a schematic diagram showing another embodiment of the sub-fab area installation apparatus.

FIG. 3 is a schematic diagram showing another embodiment of the sub-fab area installation apparatus 5. Configurations and operations of the present embodiment, which will not be particularly described, are the same as those of the embodiments described with reference to FIGS. 1 and 2, and duplicated descriptions thereof will be omitted. As shown in FIG. 3, the first downstream line 26, the second downstream line 27, and the third downstream line 28 merge to form a merging line 35 that extends to the heating unit 8. More specifically, a downstream portion of the first downstream line 26, a downstream portion of the second downstream line 27, and a downstream portion of the third downstream line 28 constitute the single merging line 35. The merging line 35 is coupled to the second evaporator 32A of the heating unit 8. The cooling-liquid line 12 further includes a bypass line 36 branching off from the merging line 35 and coupled to the cooling-liquid return line 30.

The sub-fab area installation apparatus 5 of the present embodiment further includes: a first flow-rate control valve 37, a second flow-rate control valve 38, and a third flow-rate control valve 39 provided in the first upstream line 21, the second upstream line 22, and the third upstream line 23, respectively; a first temperature-measuring device 41, a second temperature-measuring device 42, and a third temperature-measuring device 43 for measuring temperature of the cooling liquid flowing through the first downstream line 26, the second downstream line 27, and the third downstream line 28; a heating-unit flow-rate control valve 46 provided in the merging line 35; and a heating-unit flow-rate measuring device 47 provided in the merging line 35 and configured to measure a flow rate of the cooling liquid flowing through the heating unit 8. The sub-fab area installation apparatus 5 of the present embodiment further includes a valve controller 50 configured to control the operations of the first flow-rate control valve 37, the second flow-rate control valve 38, and the third flow-rate control valve 39 such that the temperatures of the cooling liquid flowing through the first downstream line 26, the second downstream line 27, and the third downstream line 28 are constant. The valve controller 50 is further configured to control the operation of the heating-unit flow-rate control valve 46 such that the flow rate of the cooling liquid flowing through the heating unit 8 is constant. The valve controller 50 includes programs and an arithmetic device (e.g., CPU or GPU) configured to perform arithmetic operations according to instructions included in the programs. The valve controller 50 is composed of, for example, at least one computer.

The first flow-rate control valve 37, the second flow-rate control valve 38, the third flow-rate control valve 39, the first temperature-measuring device 41, the second temperature-measuring device 42, the third temperature-measuring device 43, the heating-unit flow-rate control valve 46, and the heating-unit flow-rate measuring device 47 are electrically connected to the valve controller 50. The valve controller 50 controls operations of the first flow-rate control valve 37, the second flow-rate control valve 38, and the third flow-rate control valve 39 based on the temperatures of the cooling liquid measured by the first temperature-measuring device 41, the second temperature-measuring device 42, and the third temperature-measuring device 43 such that the temperatures of the cooling liquid flowing through the first downstream line 26, the second downstream line 27, and the third downstream line 28 are constant. Further, the valve controller 50 controls operation of the heating-unit flow-rate control valve 46 based on the flow rate of the cooling liquid measured by the heating-unit flow-rate measuring device 47 such that the flow rate of the cooling liquid flowing through the heating unit 8 is constant. The heating-unit flow-rate control valve 46 may be provided in the cooling-liquid return line 30 or the bypass line 36, instead of the merging line 35. The heating-unit flow-rate measuring device 47 may be provided in the cooling-liquid return line 30, instead of the merging line 35.

According to the embodiment described with reference to FIG. 3, the temperature and the flow rate of the cooling liquid flowing through the heating unit 8 are kept constant. As a result, the heating unit 8 can stably heat the second circulation liquid.

Figure 4:
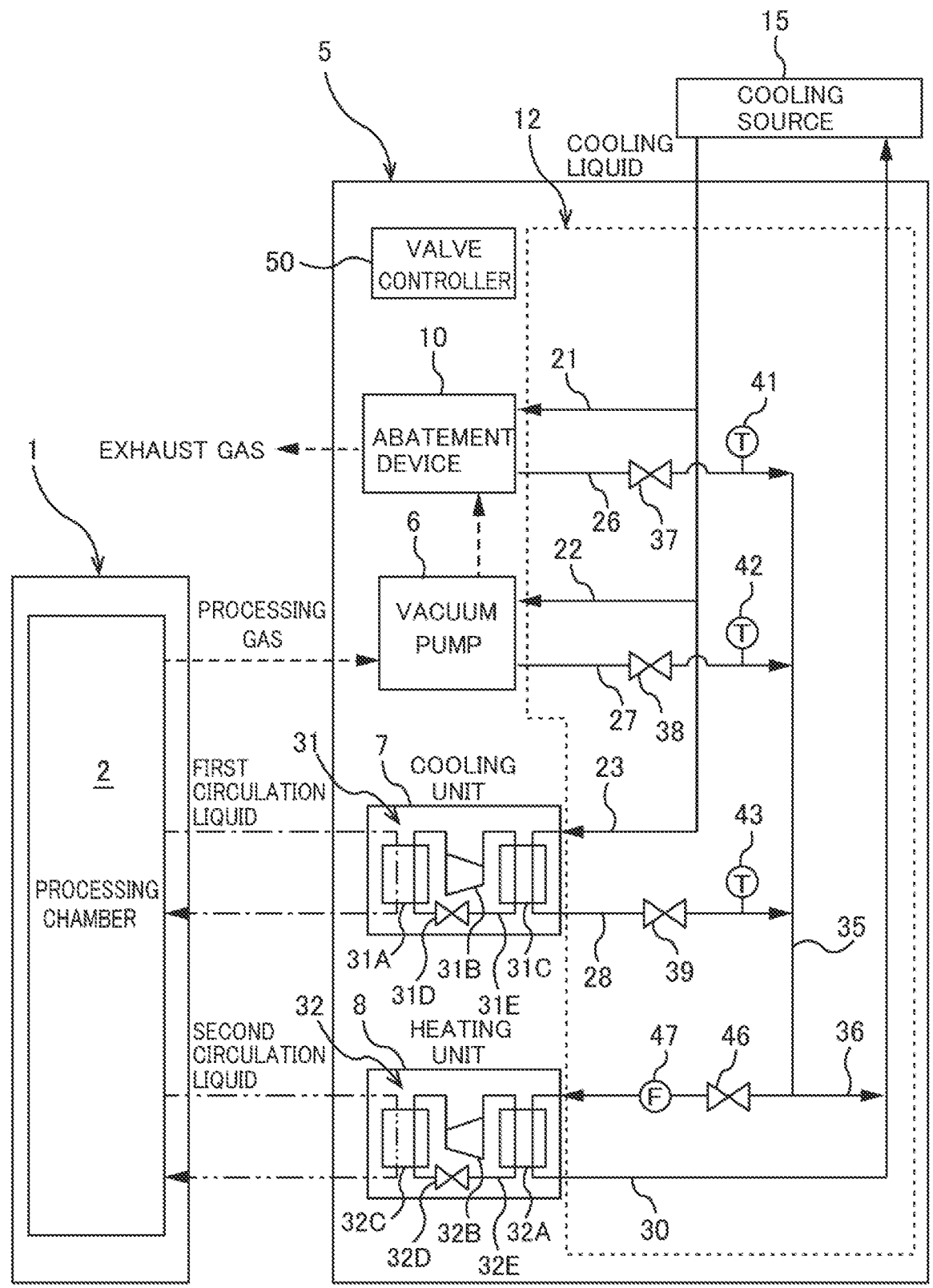
FIG. 4 is a schematic diagram showing still another embodiment of the sub-fab area installation apparatus.

FIG. 4 is a schematic diagram showing another embodiment of the sub-fab area installation apparatus 5. Configurations and operations of the present embodiment, which will not be particularly described, are the same as those of the embodiments described with reference to FIG. 3, and duplicated descriptions thereof will be omitted. In the present embodiment, the first flow-rate control valve 37, the second flow-rate control valve 38, and the third flow-rate control valve 39 are provided in the first downstream line 26, the second downstream line 27, and the third downstream line 28, respectively. The heating-unit flow-rate control valve 46 may be provided in the cooling-liquid return line 30 or the bypass line 36, instead of the merging line 35. Furthermore, the heating-unit flow-rate measuring device 47 may be provided in the cooling-liquid return line 30, instead of the merging line 35. As well as the embodiment shown in FIG. 3, according to the embodiment described with reference to FIG. 4, the temperature and the flow rate of the cooling liquid flowing through the heating unit 8 are kept constant, and as a result, the heating unit 8 can stably heat the second circulation liquid.

Figure 5:
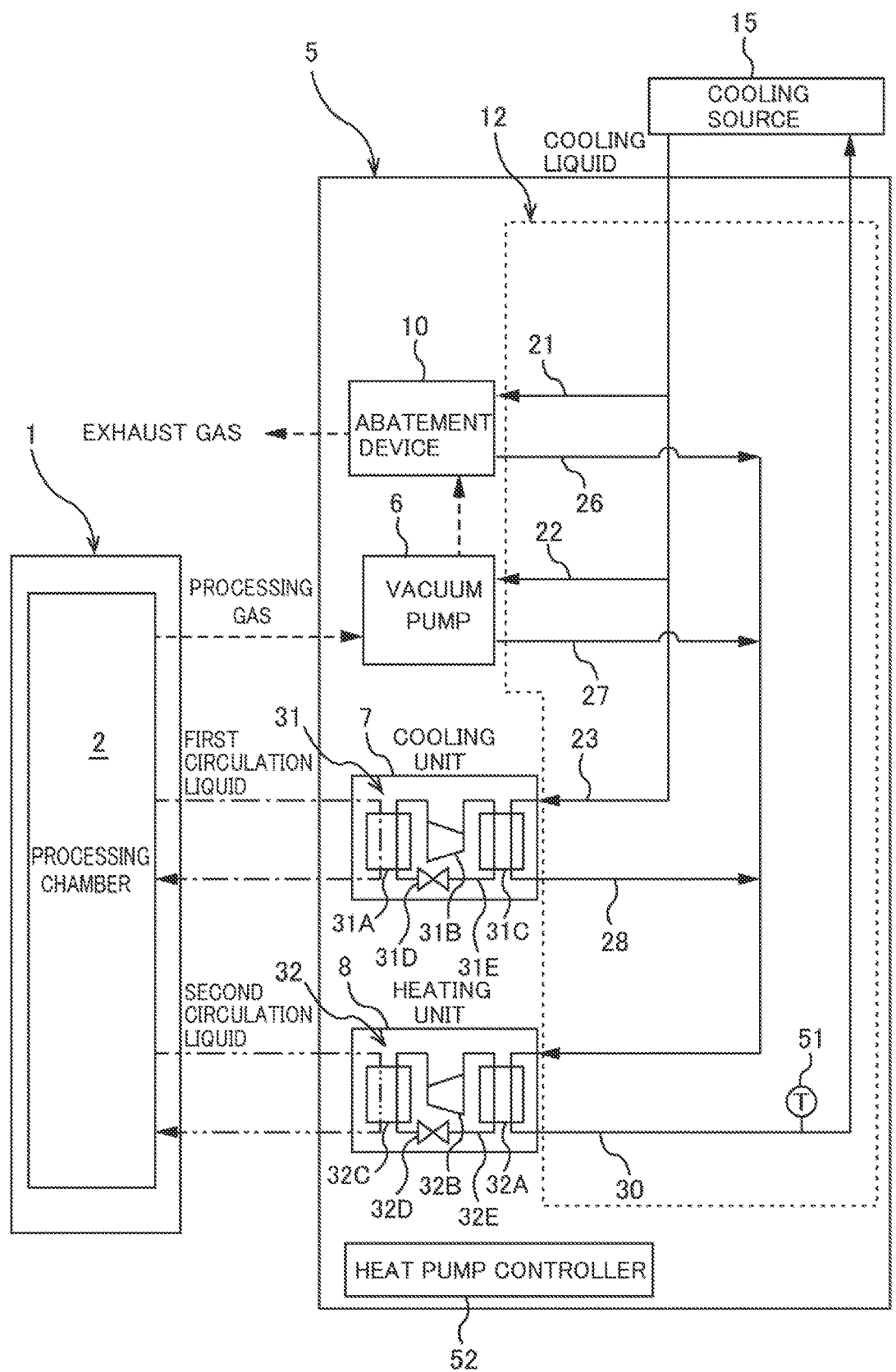
FIG. 5 is a schematic diagram showing still another embodiment of the sub-fab area installation apparatus.

FIG. 5 is a schematic diagram showing another embodiment of the sub-fab area installation apparatus 5. Configurations and operations of the present embodiment, which will not be particularly described, are the same as those of the embodiments described with reference to FIGS. 1 and 2, and duplicated descriptions thereof will be omitted. As shown in FIG. 5, the sub-fab area installation apparatus 5 further includes a return-temperature measuring device 51 configured to measure the temperature of the cooling liquid flowing through the cooling-liquid return line 30, and a heat pump controller 52 configured to control the operation of the second heat pump 32 of the heating unit 8 such that the temperature of the cooling liquid flowing through the cooling-liquid return line 30 is kept at not less than a set value. The heat pump controller 52 includes a program and an arithmetic device (e.g., CPU or GPU) configured to perform arithmetic operations according to instructions included in the program. The heat pump controller 52 is composed of, for example, at least one computer.

The heat pump controller 52 is electrically coupled to the return-temperature measuring device 51. The heat pump controller 52 controls the operation of the second heat pump 32 of the heating unit 8, particularly the operation of the second compressor 32B, such that the temperature of the cooling liquid measured by the return-temperature measuring device 51 is maintained at not less than the set value. This embodiment can make it possible to prevent the temperature of the cooling liquid to be returned to the cooling source 15 from dropping too low.

Figure 6:
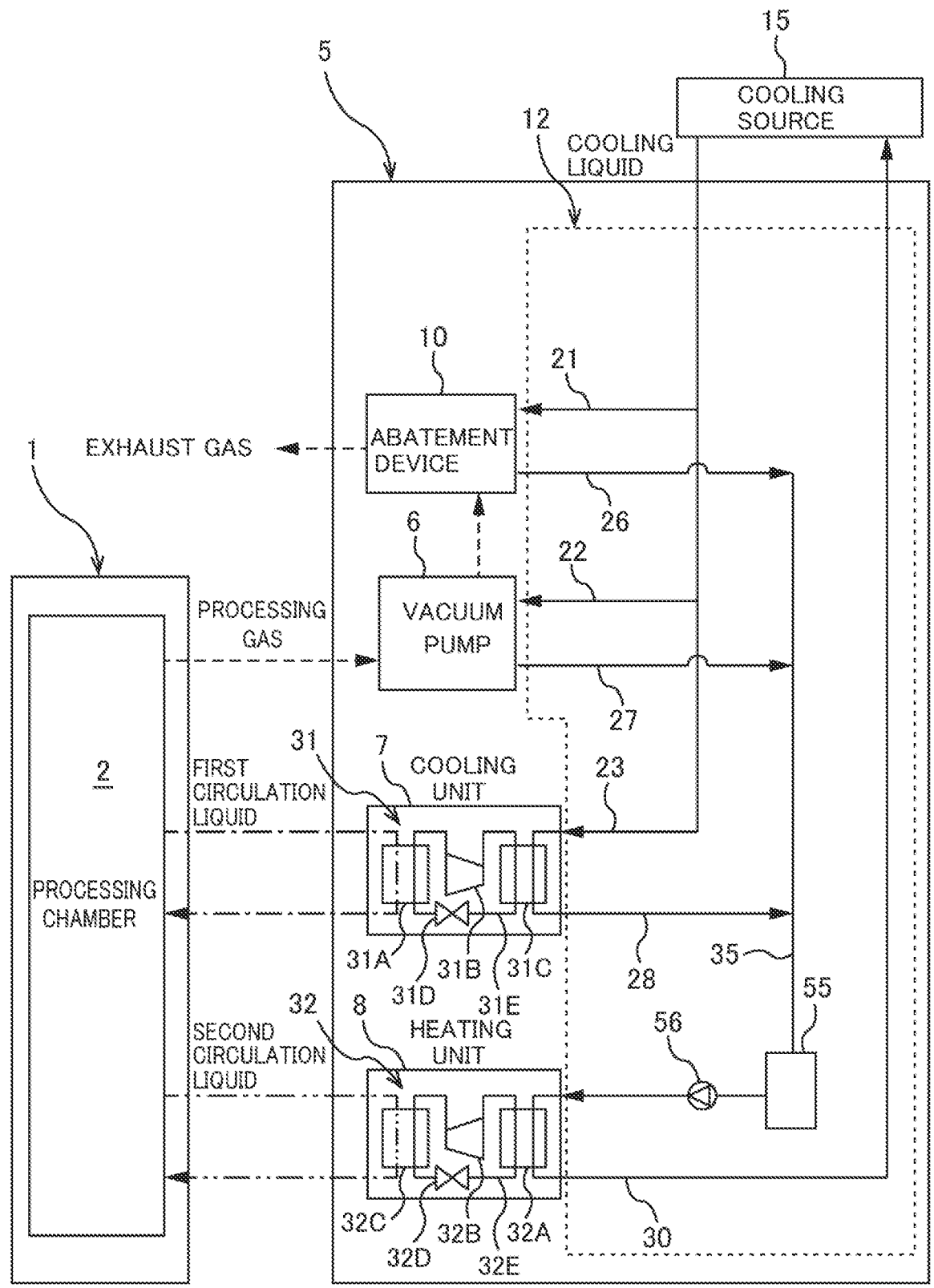
FIG. 6 is a schematic diagram showing still another embodiment of the sub-fab area installation apparatus.

FIG. 6 is a schematic diagram showing another embodiment of the sub-fab area installation apparatus 5. Configurations and operations of the present embodiment, which will not be particularly described, are the same as those of the embodiments described with reference to FIGS. 1 and 2, and duplicated descriptions thereof will be omitted. As shown in FIG. 6, the sub-fab area installation apparatus 5 further includes a buffer tank 55 coupled to the first downstream line 26, the second downstream line 27, and the third downstream line 28.

In the present embodiment, the first downstream line 26, the second downstream line 27, and the third downstream line 28 merge to form the merging line 35 that extends to the heating unit 8. The buffer tank 55 is attached to the merging line 35. In one embodiment, the first downstream line 26, the second downstream line 27, and the third downstream line 28 may be separately coupled to the buffer tank 55, and the merging line 35 may extend from the buffer tank 55 to the heating unit 8. If the pressure of the cooling liquid flowing out of the buffer tank 55 is low, a pressurizing pump 56 may be provided between the buffer tank 55 and the heating unit 8 as shown in FIG. 6. In this embodiment shown in FIG. 6, the pressurizing pump 56 is provided in the merging line 35 extending from the buffer tank 55 to the heating unit 8.

According to the present embodiment, the cooling liquid that has been heated when passing through the abatement device 10, the vacuum pump 6, and the cooling unit 7 is temporarily stored in the buffer tank 55 before being supplied to the heating unit 8. The buffer tank 55 can reduce a fluctuation in the temperature of the heated cooling liquid and can stabilize the flow rate of the cooling liquid supplied to the heating unit 8.

Figure 7:
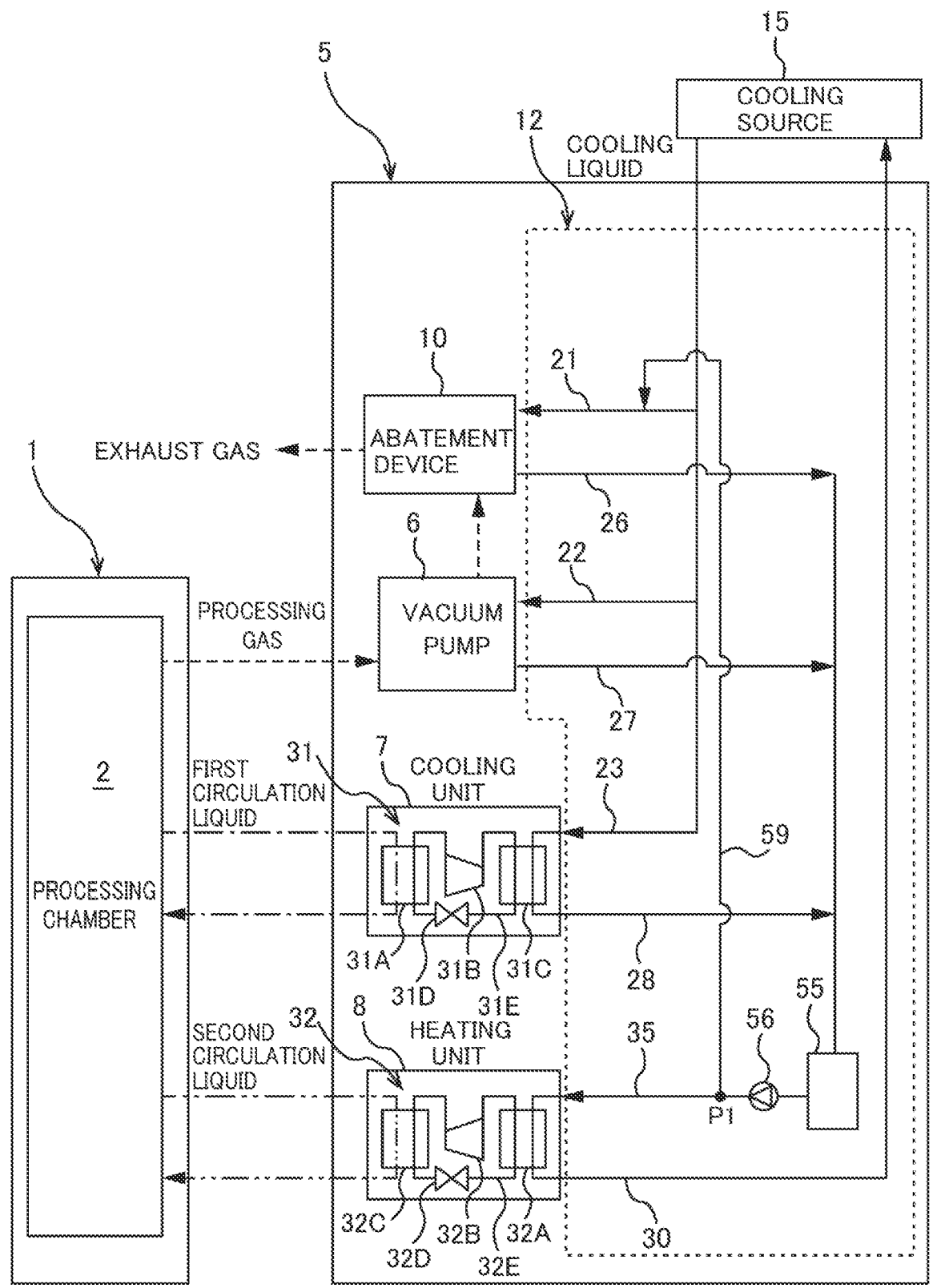
FIG. 7 is a schematic diagram showing still another embodiment of the sub-fab area installation apparatus.

FIG. 7 is a schematic diagram showing another embodiment of the sub-fab area installation apparatus 5. Configurations and operations of the present embodiment, which will not be particularly described, are the same as those of the embodiments described with reference to FIG. 6, and duplicated descriptions thereof will be omitted. As shown in FIG. 7, the cooling-liquid line 12 further includes a reheating line 59 branching off from the merging line 35. The reheating line 59 extends from the merging line 35 to the first upstream line 21. A branch point P1 of the reheating line 59 from the merging line 35 is located between the buffer tank 55 and the heating unit 8.

According to the present embodiment, when the cooling liquid in the buffer tank 55 does not have a temperature high enough to serve as a driving heat source for heating the second circulation liquid flowing through the heating unit 8, the cooling liquid is returned to the abatement device 10 and can be heated again.

Figure 8:
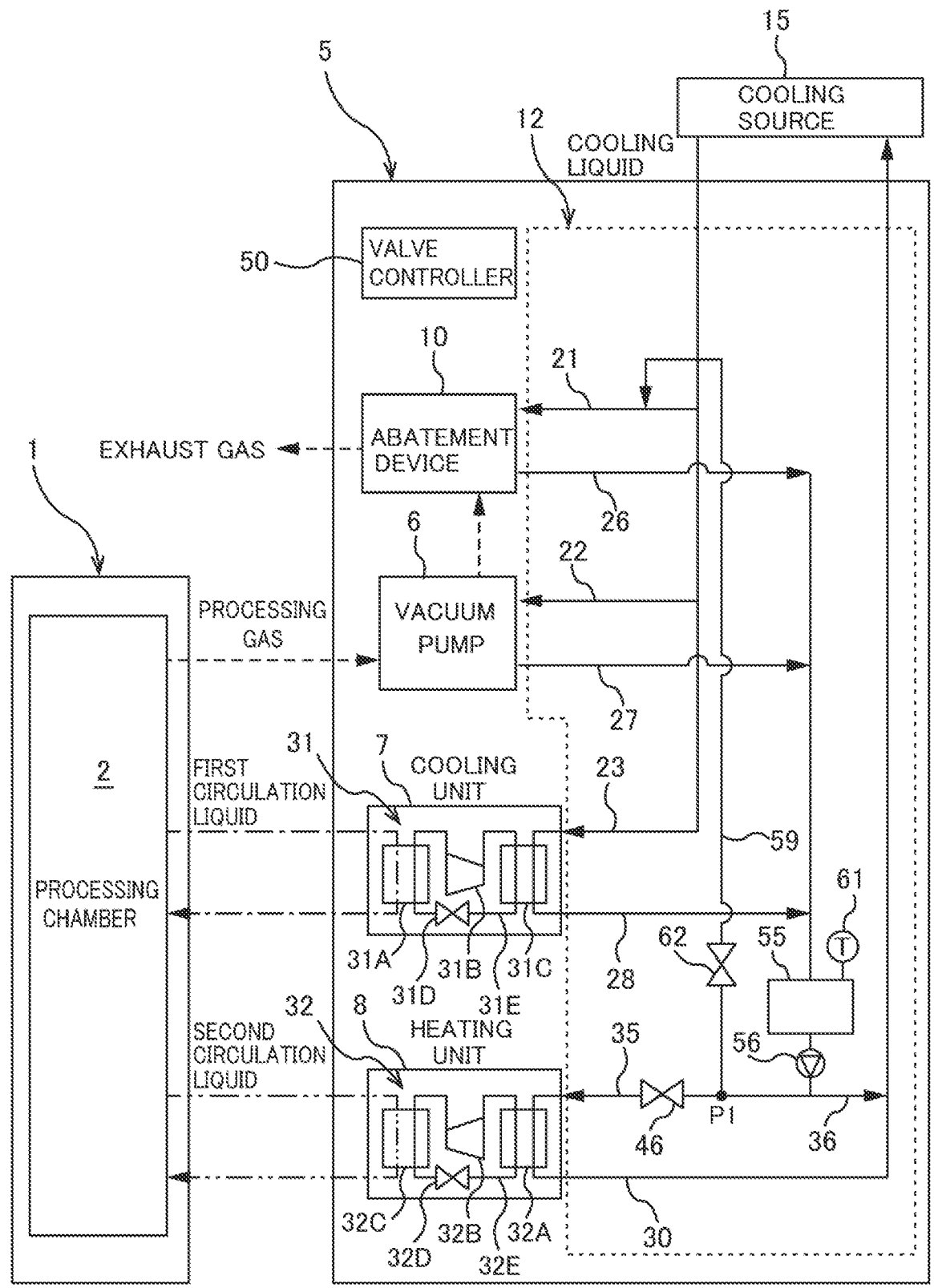
FIG. 8 is a schematic diagram showing still another embodiment of the sub-fab area installation apparatus.

FIG. 8 is a schematic diagram showing another embodiment of the sub-fab area installation apparatus 5. Configurations and operations of the present embodiment, which will not be particularly described, are the same as those of the embodiments described with reference to FIG. 7, and duplicated descriptions thereof will be omitted. As shown in FIG. 8, the cooling-liquid line 12 further includes a bypass line 36 branching off from the merging line 35 and coupled to the cooling-liquid return line 30.

The sub-fab area installation apparatus 5 of the present embodiment further includes an in-tank temperature measuring device 61 configured to measure the temperature of the cooling liquid in the buffer tank 55, a reheating flow-rate control valve 62 attached to the reheating line 59, and the heating-unit flow-rate control valve 46 provided in the merging line 35. The sub-fab area installation apparatus 5 of the present embodiment further includes valve controller 50 configured to control the operations of the reheating flow-rate control valve 62 and the heating-unit flow-rate control valve 46 such that the flow rate of the cooling liquid flowing through the reheating line 59 has a predetermined value when the temperature of the cooling liquid in the buffer tank 55 is not more than a set value.

The in-tank temperature measuring device 61, the reheating flow-rate control valve 62 and the heating-unit flow-rate control valve 46 are electrically coupled to the valve controller 50. When the temperature of the cooling liquid in the buffer tank 55 measured by the in-tank temperature measuring device 61 is equal to or lower than the set value, the valve controller 50 controls the operations of the reheating flow-rate control valve 62 and the heating-unit flow-rate control valve 46 so as to maintain the flow rate of the cooling liquid flowing through the reheating line 59 at the predetermined value. The heating-unit flow-rate control valve 46 may be provided in the bypass line 36 or the cooling-liquid return line 30, instead of the merging line 35.

According to the present embodiment, when the cooling liquid in the buffer tank 55 does not have a temperature high enough to serve as a driving heat source for heating the second circulation liquid flowing through the heating unit 8, the cooling liquid is returned to the abatement device 10 and can be heated again.

Figure 9:
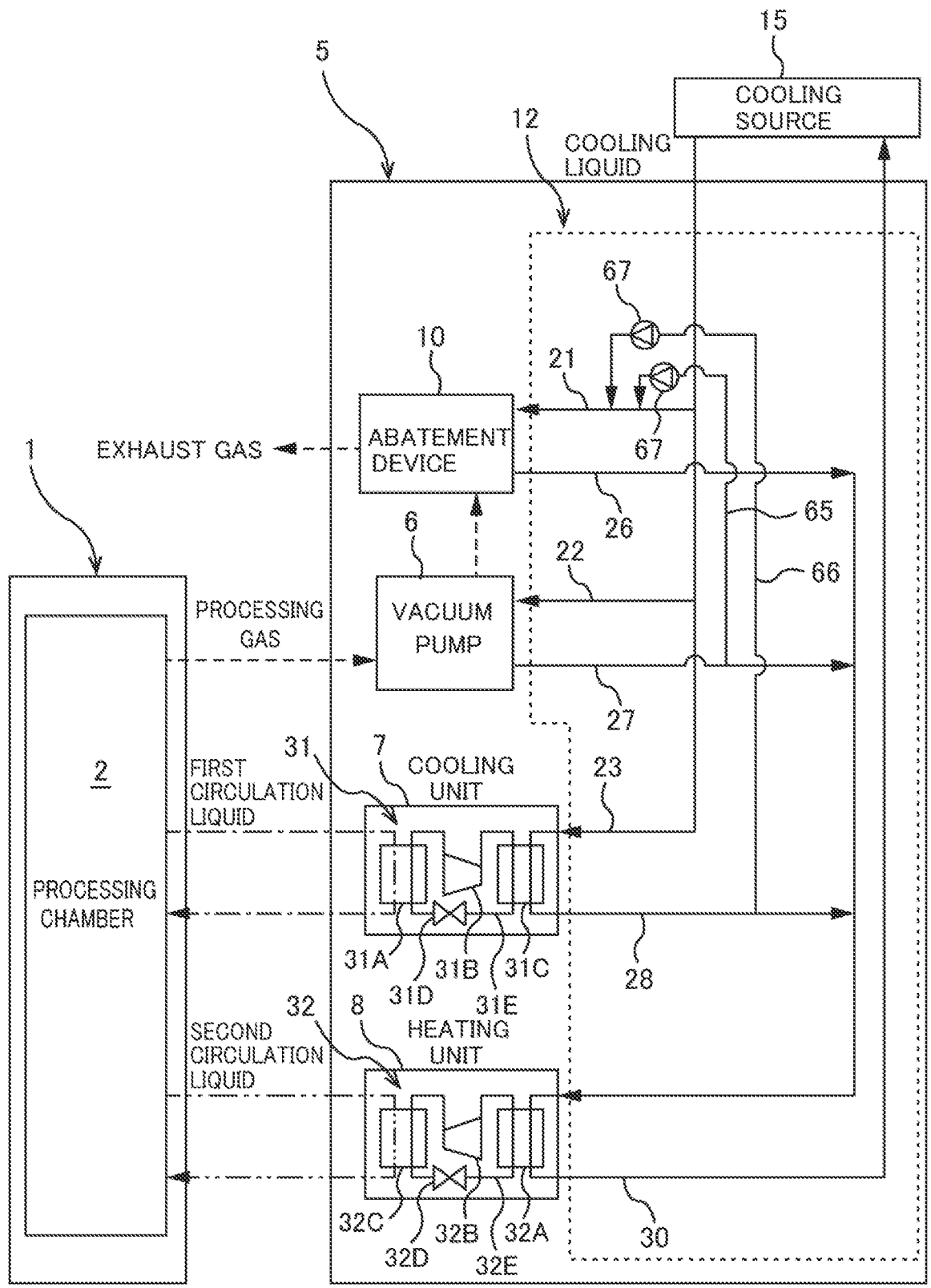
FIG. 9 is a schematic diagram showing still another embodiment of the sub-fab area installation apparatus.

FIG. 9 is a schematic diagram showing another embodiment of the sub-fab area installation apparatus 5. Configurations and operations of the present embodiment, which will not be particularly described, are the same as those of the embodiments described with reference to FIGS. 1 and 2, and duplicated descriptions thereof will be omitted. As shown in FIG. 9, the cooling-liquid line 12 further includes a second reheating line 65 branching off from the second downstream line 27 and a third reheating line 66 branching off from the third downstream line 28. The second reheating line 65 and the third reheating line 66 are coupled to the first upstream line 21 via two pressurizing pumps 67 and 67.

The configurations of the second reheating line 65 and the third reheating line 66 are not particularly limited as long as the second reheating line 65 and the third reheating line 66 extend from the second downstream line 27 and the third downstream line 28 to the first upstream line 21. For example, the second reheating line 65 and the third reheating line 66 may be two independent lines, or two lines may merge into one line. In the example shown in FIG. 9, the second reheating line 65 and the third reheating line 66 are two independent lines, and the two pressurizing pumps 67 and 67 are coupled to the second reheating line 65 and the third reheating line 66, respectively. In one embodiment, the second reheating line 65 and the third reheating line 66 may merge to form one merging reheating line, and one pressurizing pump 67 may be coupled to the merging reheating line.

According to the embodiment described with reference to FIG. 9, when the cooling liquid that has passed through the vacuum pump 6 and the cooling unit 7 does not have a temperature high enough to serve as a driving heat source for heating the second circulation liquid flowing through the heating unit 8, the cooling liquid is returned to the abatement device 10 and can be heated again.

Figure 10:
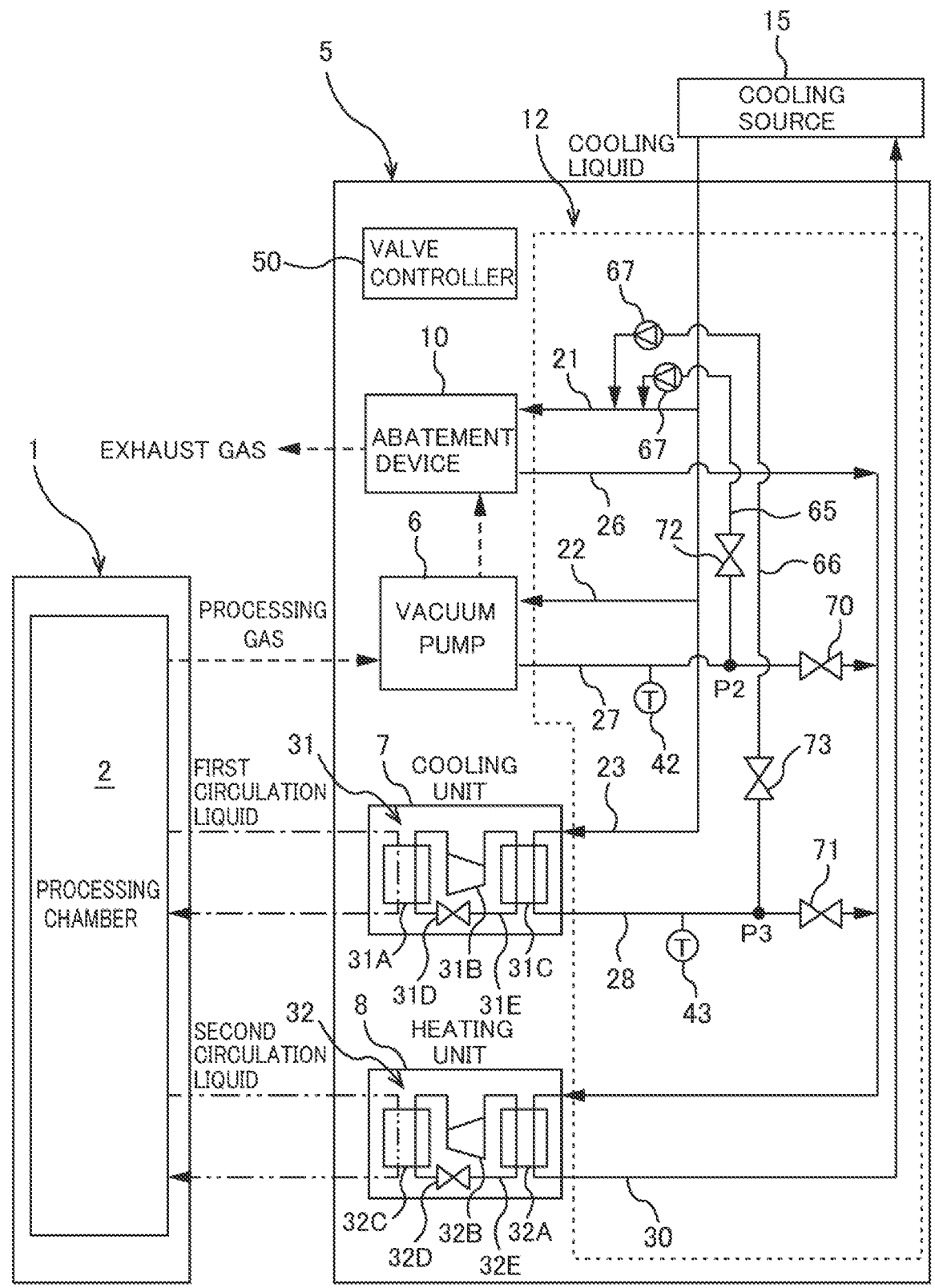
FIG. 10 is a schematic diagram showing still another embodiment of the sub-fab area installation apparatus.

FIG. 10 is a schematic diagram showing another embodiment of the sub-fab area installation apparatus 5. Configurations and operations of the present embodiment, which will not be particularly described, are the same as those of the embodiments described with reference to FIG. 9, and duplicated descriptions thereof will be omitted. As shown in FIG. 10, the sub-fab area installation apparatus 5 of the present embodiment further includes a second downstream flow-rate control valve 70 provided in the second downstream line 27 at a position downstream of a branch point P2 between the second downstream line 27 and the second reheating line 65, a third downstream flow-rate control valve 71 provided in the third downstream line 28 at a position downstream of a branch point P3 between the third downstream line 28 and the third reheating line 66, a second temperature-measuring device 42 and a third temperature-measuring device 43 configured to measure the temperature of the cooling liquid flowing through the second downstream line 27 and the third downstream line 28, a second reheating flow-rate control valve 72 and a third reheating flow-rate control valve 73 provided in the second reheating line 65 and the third reheating line 66, respectively, and, valve controller 50 configured to control the operations of the second reheating flow-rate control valve 72 and the third flow-rate control valve 73.

The valve controller 50 is electrically coupled to the second temperature-measuring device 42, the third temperature-measuring device 43, the second downstream flow-rate control valve 70, the third downstream flow-rate control valve 71, the second reheating flow-rate control valve 72, and the third reheating flow-rate control valve 73. The valve controller 50 is configured to reduce an opening degree of the second downstream flow-rate control valve 70 and increase an opening degree of the second reheating flow-rate control valve 72 when the temperature of the cooling liquid flowing through the second downstream line 27, measured by the second temperature-measuring device 42, is lower than a threshold value. The valve controller 50 is further configured to reduce the opening degree of the third downstream flow-rate control valve 71 and increase the opening degree of the third reheating flow-rate control valve 73 when the temperature of the cooling liquid flowing through the third downstream line 28, measured by the third temperature-measuring device 43, is lower than a threshold value.

Reducing the opening degree of the second downstream flow-rate control valve 70 includes completely closing the second downstream flow-rate control valve 70 (i.e., reducing the opening degree to 0%). Reducing the opening degree of the third downstream flow-rate control valve 71 includes completely closing the third downstream flow-rate control valve 71 (i.e., reducing the opening degree to 0%). Similarly, increasing the opening degree of the second reheating flow-rate control valve 72 includes fully opening the second reheating flow-rate control valve 72 (i.e., increasing the opening degree to 100%). Increasing the opening degree of the third reheating flow-rate control valve 73 includes fully opening the third reheating flow-rate control valve 73 (i.e., increasing the opening degree to 100%). The valve controller 50 controls the operations of the second reheating flow-rate control valve 72 and the third reheating flow-rate control valve 73 within a range in which the flow rate of the cooling liquid flowing into the abatement device 10 does not exceed a limit.

According to the present embodiment, when the cooling liquid that has passed through the vacuum pump 6 and the cooling unit 7 does not have a temperature high enough to serve as a driving heat source for heating the second circulation liquid flowing through the heating unit 8, the cooling liquid is returned to the abatement device 10 and can be heated again.

Figure 11:
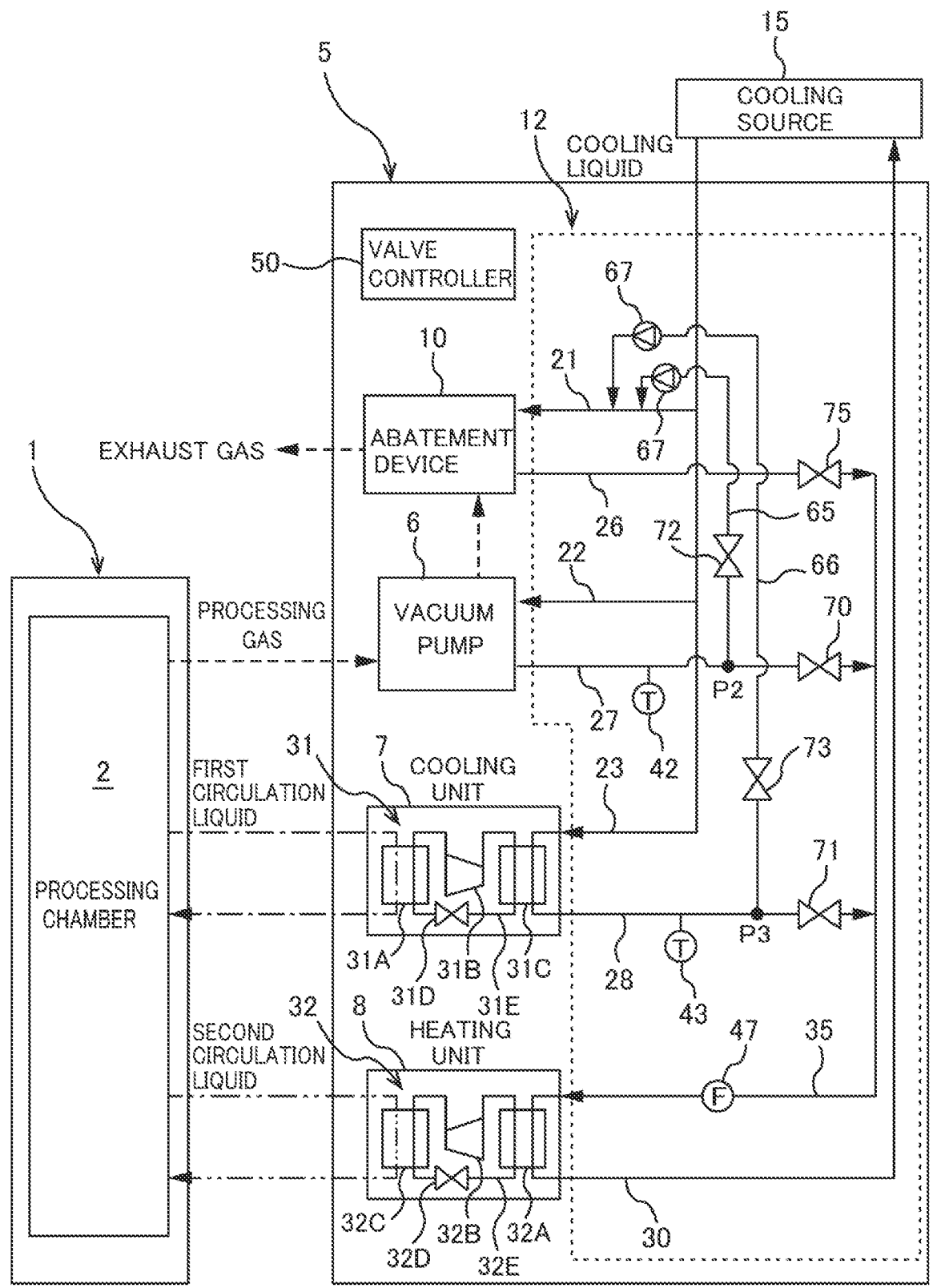
FIG. 11 is a schematic diagram showing still another embodiment of the sub-fab area installation apparatus.

FIG. 11 is a schematic diagram showing another embodiment of the sub-fab area installation apparatus 5. Configurations and operations of the present embodiment, which will not be particularly described, are the same as those of the embodiments described with reference to FIG. 10, and duplicated descriptions thereof will be omitted. The sub-fab area installation apparatus 5 of the present embodiment further includes a first downstream flow-rate control valve 75 provided in the first downstream line 26, and a heating-unit flow-rate measuring device 47 configured to measure the flow rate of the cooling liquid flowing through the heating unit 8.

The heating-unit flow-rate measuring device 47 may be located upstream or downstream of the heating unit 8. In the embodiment of FIG. 11, the first downstream line 26, the second downstream line 27, and the third downstream line 28 merge to form the merging line 35 that extends to the heating unit 8. The heating-unit flow-rate measuring device 47 is provided in the merging line 35. In one embodiment, the heating-unit flow-rate measuring device 47 may be provided in the cooling-liquid return line 30, instead of the merging line 35.

The valve controller 50 is further electrically coupled to the first downstream flow-rate control valve 75 and the heating-unit flow-rate measuring device 47. The valve controller 50 is further configured to control the operation of the first downstream flow-rate control valve 75 such that the flow rate of the cooling liquid flowing through the heating unit 8, measured by the heating-unit flow-rate measuring device 47, is constant. According to the present embodiment, since the flow rate of the cooling liquid flowing through the heating unit 8 is kept constant, the heating unit 8 can stably heat the second circulation liquid.

Figure 12:
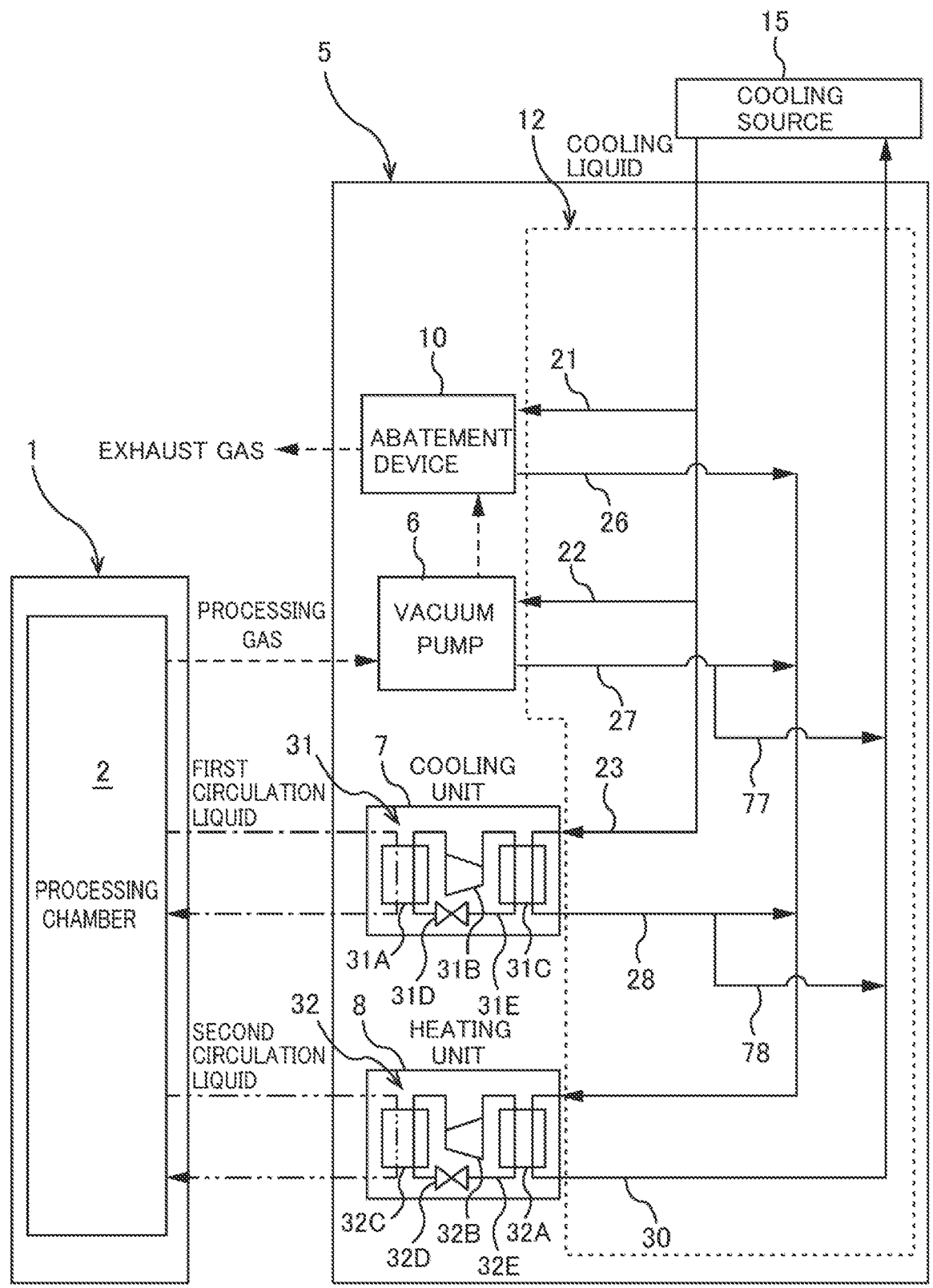
FIG. 12 is a schematic diagram showing still another embodiment of the sub-fab area installation apparatus.

FIG. 12 is a schematic diagram showing another embodiment of the sub-fab area installation apparatus 5. Configurations and operations of the present embodiment, which will not be particularly described, are the same as those of the embodiments described with reference to FIGS. 1 and 2, and duplicated descriptions thereof will be omitted. As shown in FIG. 12, the cooling-liquid line 12 further includes a second return line 77 branching off from the second downstream line 27 and a third return line 78 branching off from the third downstream line 28. The second return line 77 and the third return line 78 are coupled to the cooling-liquid return line 30. The configurations of the second return line 77 and the third return line 78 are not limited particularly as long as the second return line 77 and the third return line 78 extend from the second downstream line 27 and the third downstream line 28 to the cooling-liquid return line 30. For example, the second return line 77 and the third return line 78 may be two independent lines, or two lines may merge into a single merging return line coupled to the cooling-liquid return line 30.

According to the present embodiment, when the cooling liquid that has passed through the vacuum pump 6 and the cooling unit 7 does not have a temperature high enough to serve as a driving heat source for heating the second circulation liquid flowing through the heating unit 8, the cooling liquid is returned to the cooling source 15 instead of supplying to the heating unit 8, whereby the heating function of the heating unit 8 can be maintained.

Figure 13:
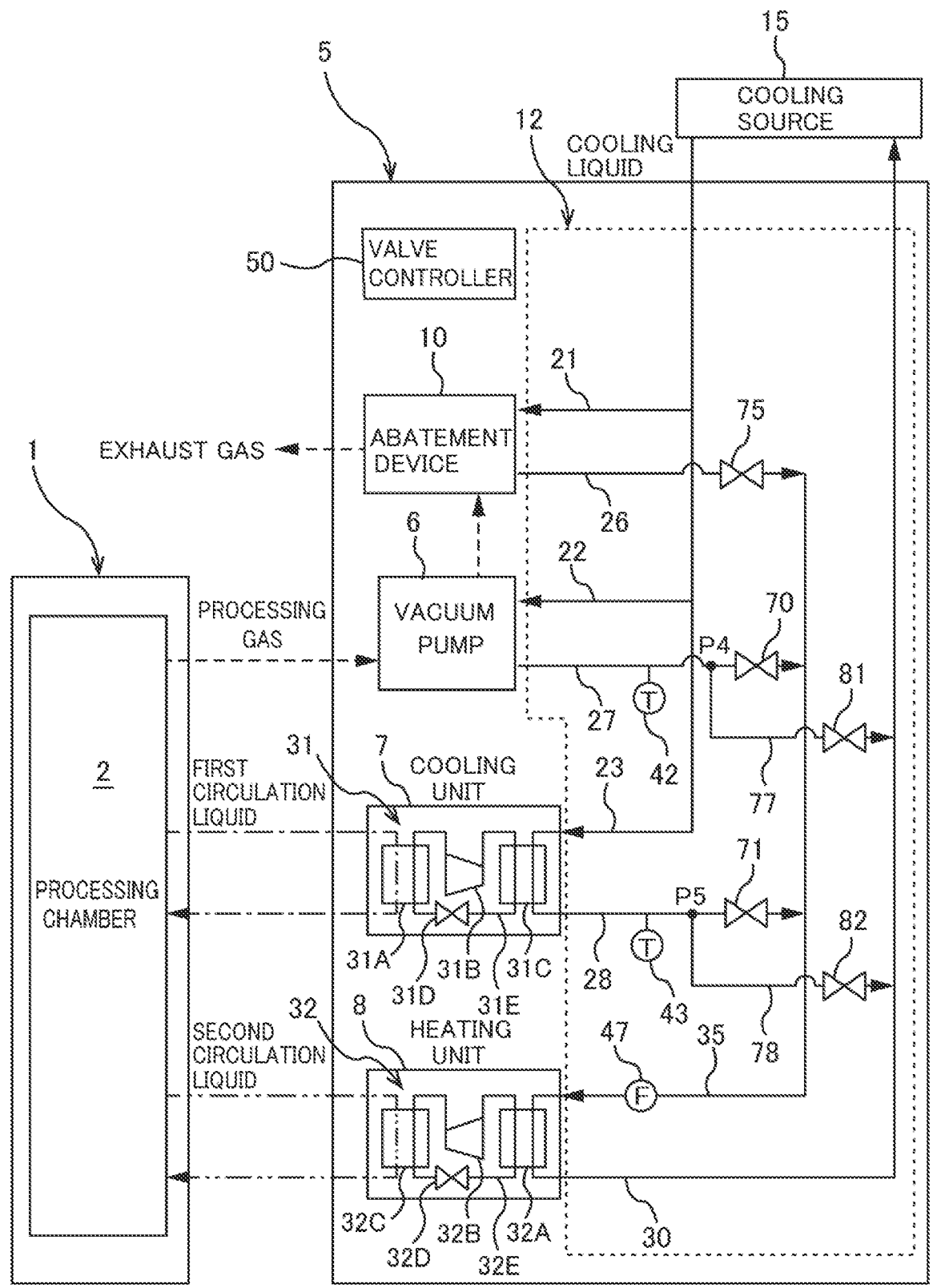
FIG. 13 is a schematic diagram showing still another embodiment of the sub-fab area installation apparatus.

FIG. 13 is a schematic diagram showing another embodiment of the sub-fab area installation apparatus 5. Configurations and operations of the present embodiment, which will not be particularly described, are the same as those of the embodiments described with reference to FIG. 12, and duplicated descriptions thereof will be omitted. The sub-fab area installation apparatus 5 of the present embodiment includes: a first downstream flow-rate control valve 75 provided in the first downstream line 26; a second downstream flow-rate control valve 70 provided in the second downstream line 27 at a position downstream of a branch point P4 between the second downstream line 27 and the second return line 77; a third downstream flow-rate control valve 71 provided in the third downstream line 28 at a position downstream of a branch point P5 between the third downstream line 28 and the third return line 78; a second temperature-measuring device 42 and a third temperature-measuring device 43 configured to measure the temperature of the cooling liquid flowing through the second downstream line 27 and the third downstream line 28; a second return flow-rate control valve 81 and a third return flow-rate control valve 82 provided in the second return line 77 and the third return line 78, respectively; heating-unit flow-rate measuring device 47 configured to measure the flow rate of the cooling liquid flowing through the heating unit 8; and valve controller 50 configured to control the operations of the first downstream flow-rate control valve 75, the second downstream flow-rate control valve 70, the third downstream flow-rate control valve 71, the second return flow-rate control valve 81, and the third return flow-rate control valve 82.

The heating-unit flow-rate measuring device 47 may be located upstream or downstream of the heating unit 8. In the embodiment of FIG. 13, the first downstream line 26, the second downstream line 27, and the third downstream line 28 merge to form the merging line 35 that extends to the heating unit 8. The heating-unit flow-rate measuring device 47 is provided in the merging line 35. In one embodiment, the heating-unit flow-rate measuring device 47 may be provided in the cooling-liquid return line 30, instead of the merging line 35.

The second temperature-measuring device 42, the third temperature-measuring device 43, the heating-unit flow-rate measuring device 47, the first downstream flow-rate control valve 75, the second downstream flow-rate control valve 70, the third downstream flow-rate control valve 71, the second return flow-rate control valve 81 and the third return flow-rate control valve 82 are electrically coupled to the valve controller 50. The valve controller 50 is configured to reduce the opening degree of the second downstream flow-rate control valve 70 and increase the opening degree of the second return flow-rate control valve 81 when the temperature of the cooling liquid flowing through the second downstream line 27, measured by the second temperature-measuring device 42, is lower than a threshold value. The valve controller 50 is further configured to reduce the opening degree of the third downstream flow-rate control valve 71 and increase the opening degree of the third return flow-rate control valve 82 when the temperature of the cooling liquid flowing through the third downstream line 28, measured by the third temperature-measuring device 43, is lower than a threshold value. The valve controller 50 is further configured to control the operation of the first downstream flow-rate control valve 75 such that the flow rate of the cooling liquid flowing through the heating unit 8, measured by the heating-unit flow-rate measuring device 47, is constant.

Reducing the opening degree of the second downstream flow-rate control valve 70 includes completely closing the second downstream flow-rate control valve 70 (i.e., reducing the opening degree to 0%). Reducing the opening degree of the third downstream flow-rate control valve 71 includes completely closing the third downstream flow-rate control valve 71 (i.e., reducing the opening degree to 0%). Similarly, increasing the opening degree of the second return flow-rate control valve 81 includes fully opening the second return flow-rate control valve 81 (i.e., increasing the opening degree to 100%). Increasing the opening degree of the third return flow-rate control valve 82 includes fully opening the third return flow-rate control valve 82 (i.e., increasing the opening degree to 100%).

According to the present embodiment, when the cooling liquid that has passed through at least one of the vacuum pump 6 and the cooling unit 7 does not have a temperature high enough to serve as a driving heat source for heating the second circulation liquid flowing through the heating unit 8, the cooling liquid is returned to the cooling source 15 instead of supplying to the heating unit 8, whereby the heating function of the heating unit 8 can be maintained.

Figure 14:
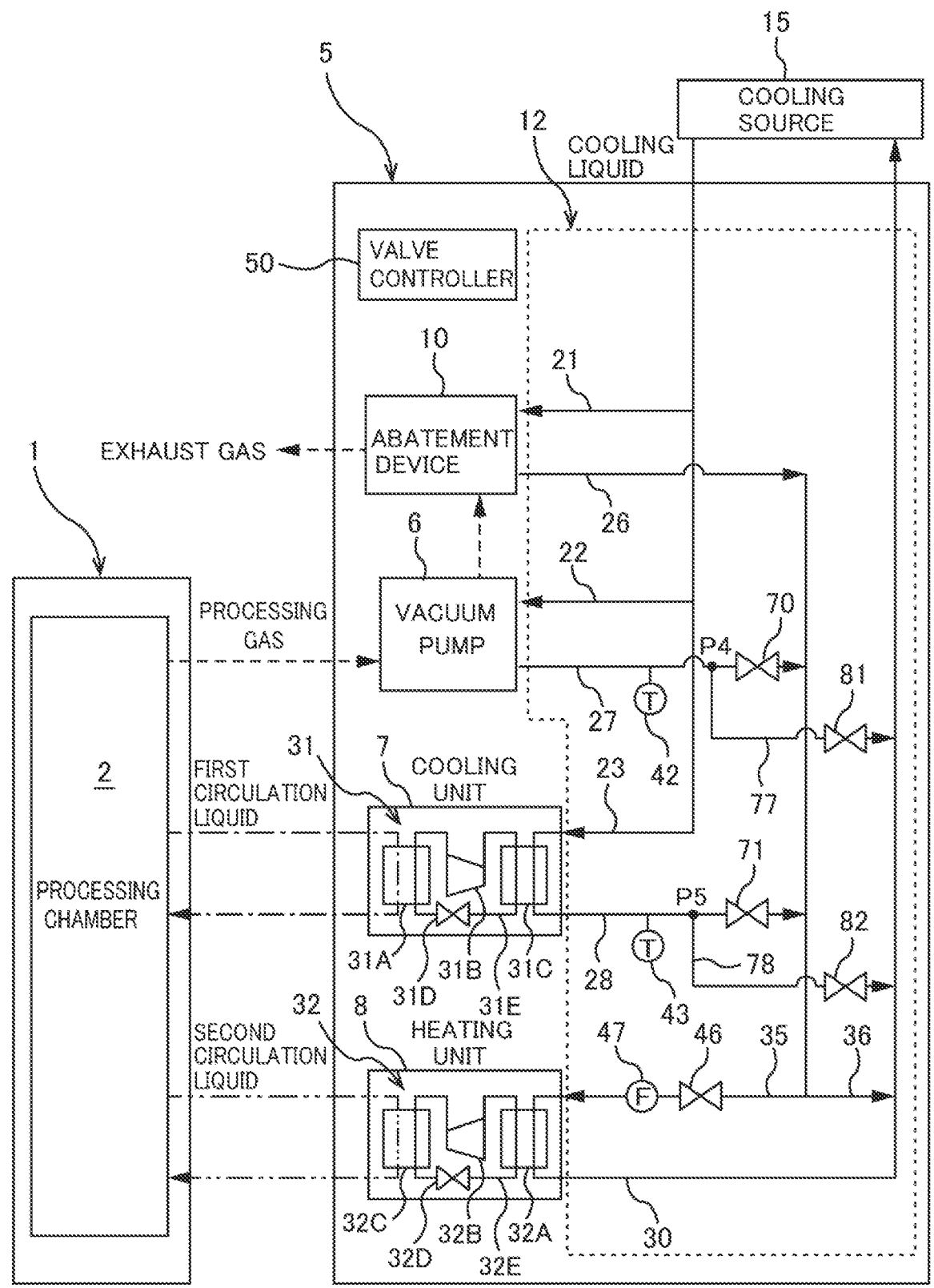
FIG. 14 is a schematic diagram showing still another embodiment of the sub-fab area installation apparatus.

FIG. 14 is a schematic diagram showing another embodiment of the sub-fab area installation apparatus 5. Configurations and operations of the present embodiment, which will not be particularly described, are the same as those of the embodiments described with reference to FIG. 12, and duplicated descriptions thereof will be omitted. The first downstream line 26, the second downstream line 27, and the third downstream line 28 merge to form the merging line 35 that extends to the heating unit 8. The cooling-liquid line 12 further includes bypass line 36 branching off from the merging line 35 and coupled to the cooling-liquid return line 30.

The sub-fab area installation apparatus 5 includes: second downstream flow-rate control valve 70 provided in the second downstream line 27 at a position downstream of the branch point P4 between the second downstream line 27 and the second return line 77; third downstream flow-rate control valve 71 provided in the third downstream line 28 at a position downstream of the branch point P5 between the third downstream line 28 and the third return line 78; second temperature-measuring device 42 and third temperature-measuring device 43 configured to measure the temperature of the cooling liquid flowing through the second downstream line 27 and the third downstream line 28; a second return flow-rate control valve 81 and a third return flow-rate control valve 82 provided in the second return line 77 and the third return line 78, respectively; heating-unit flow-rate measuring device 47 configured to measure the flow rate of the cooling liquid flowing through the heating unit 8; heating-unit flow-rate control valve 46 provided in the merging line 35; and valve controller 50 configured to control the operations of the second downstream flow-rate control valve 70, the third downstream flow-rate control valve 71, the second return flow-rate control valve 81, the third return flow-rate control valve 82, and the heating-unit flow-rate control valve 46.

The heating-unit flow-rate measuring device 47 may be located upstream or downstream of the heating unit 8. In the embodiment of FIG. 14, the heating-unit flow-rate measuring device 47 is provided in the merging line 35, while in one embodiment, the heating-unit flow-rate measuring device 47 may be provided in the cooling-liquid return fine 30, instead of the merging line 35. The heating-unit flow-rate control valve 46 may be provided in the cooling-liquid return line 30 or the bypass line 36, instead of the merging line 35.

The second temperature-measuring device 42, the third temperature-measuring device 43, the heating-unit flow-rate measuring device 47, the second downstream flow-rate control valve 70, the third downstream flow-rate control valve 71, the second return flow-rate control valve 81, the third return flow-rate control valve 82, and the heating-unit flow-rate control valve 46 are electrically coupled to the valve controller 50. The valve controller 50 is configured to reduce the opening degree of the second downstream flow-rate control valve 70 and increase the opening degree of the second return flow-rate control valve 81 when the temperature of the cooling liquid flowing through the second downstream line 27, measured by the second temperature-measuring device 42, is lower than a threshold value. The valve controller 50 is further configured to reduce the opening degree of the third downstream flow-rate control valve 71 and increase the opening degree of the third return flow-rate control valve 82 when the temperature of the cooling liquid flowing through the third downstream line 28, measured by the third temperature-measuring device 43, is lower than a threshold value. The valve controller 50 is further configured to control the operation of the heating-unit flow-rate control valve 46 such that the flow rate of the cooling liquid flowing through the heating unit 8, measured by the heating-unit flow-rate measuring device 47, is constant.

Reducing the opening degree of the second downstream flow-rate control valve 70 includes completely closing the second downstream flow-rate control valve 70 (i.e., reducing the opening degree to 0%). Reducing the opening degree of the third downstream flow-rate control valve 71 includes completely closing the third downstream flow-rate control valve reducing the opening degree to 0%). Similarly, increasing the opening degree of the second return flow-rate control valve 81 includes fully opening the second return flow-rate control valve 81 (i.e., increasing the opening degree to 100%). Increasing the opening degree of the third return flow-rate control valve 82 includes fully opening the third return flow-rate control valve 82 (i.e., increasing the opening degree to 100%).

According to the present embodiment, when the cooling liquid that has passed through at least one of the vacuum pump 6 and the cooling unit 7 does not have a temperature high enough to serve as a driving heat source for heating the second circulation liquid flowing through the heating unit 8, the cooling liquid is returned to the cooling source 15 instead of supplying to the heating unit 8, whereby the heating function of the heating unit 8 can be maintained.

Figure 15:
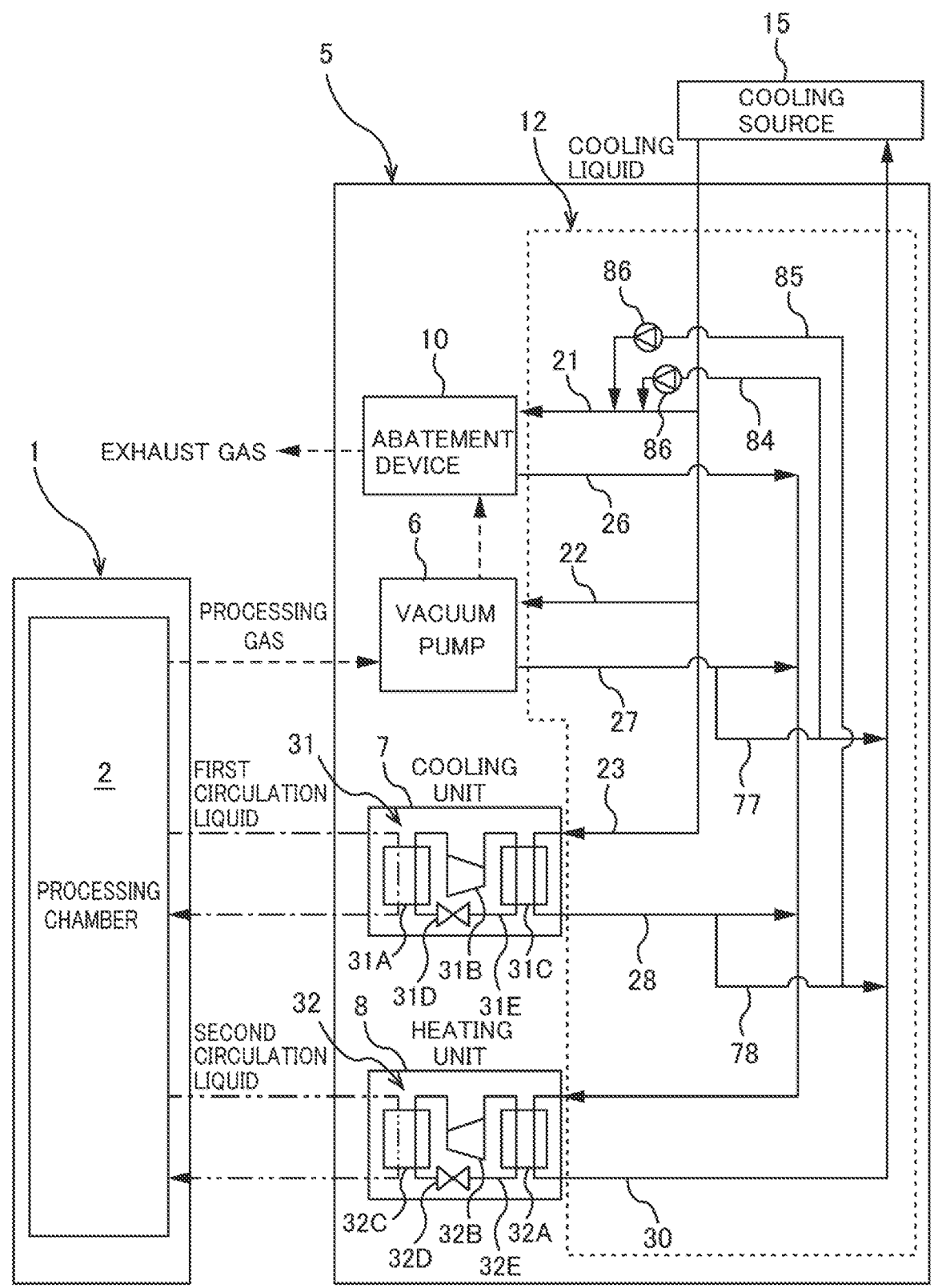
FIG. 15 is a schematic diagram showing still another embodiment of the sub-fab area installation apparatus.

FIG. 15 is a schematic diagram showing another embodiment of the sub-fab area installation apparatus 5. Configurations and operations of the present embodiment, which will not be particularly described, are the same as those of the embodiments described with reference to FIG. 12, and duplicated descriptions thereof will be omitted. The cooling-liquid line 12 further includes a second return reheating line 84 branching off from the second return line 77, and a third return reheating line 85 branching off from the third return line 78. The second return reheating line 84 and the third return reheating line 85 are coupled to the first upstream line 21 via two pressurizing pumps 86 and 86.

The configurations of the second return reheating line 84 and the third return reheating line 85 are not limited particularly as long as the second return reheating line 84 and the third return reheating line 85 extend from the second return line 77 and the third return line 78 to the first upstream line 21. For example, the second return reheating line 84 and the third return reheating line 85 may be two independent lines, or two lines may merge into one line. In the example shown in FIG. 15, the second return reheating line 84 and the third return reheating line 85 are two independent lines, and the two pressurizing pumps 86 and 86 are coupled to the second return reheating line 84 and the third return reheating line 85, respectively. In one embodiment, the second return reheating line 84 and the third return reheating line 85 may merge to form a single merging return reheating line, and one pressurizing pump 86 may be coupled to this merging return reheating line.

According to the present embodiment, when the cooling liquid that has passed through the vacuum pump 6 and the cooling unit 7 does not have a temperature high enough to serve as a driving heat source for heating the second circulation liquid flowing through the heating unit 8, the cooling liquid is returned to the cooling source 15, or returned to the abatement device 10 and can be heated again.

Figure 16:
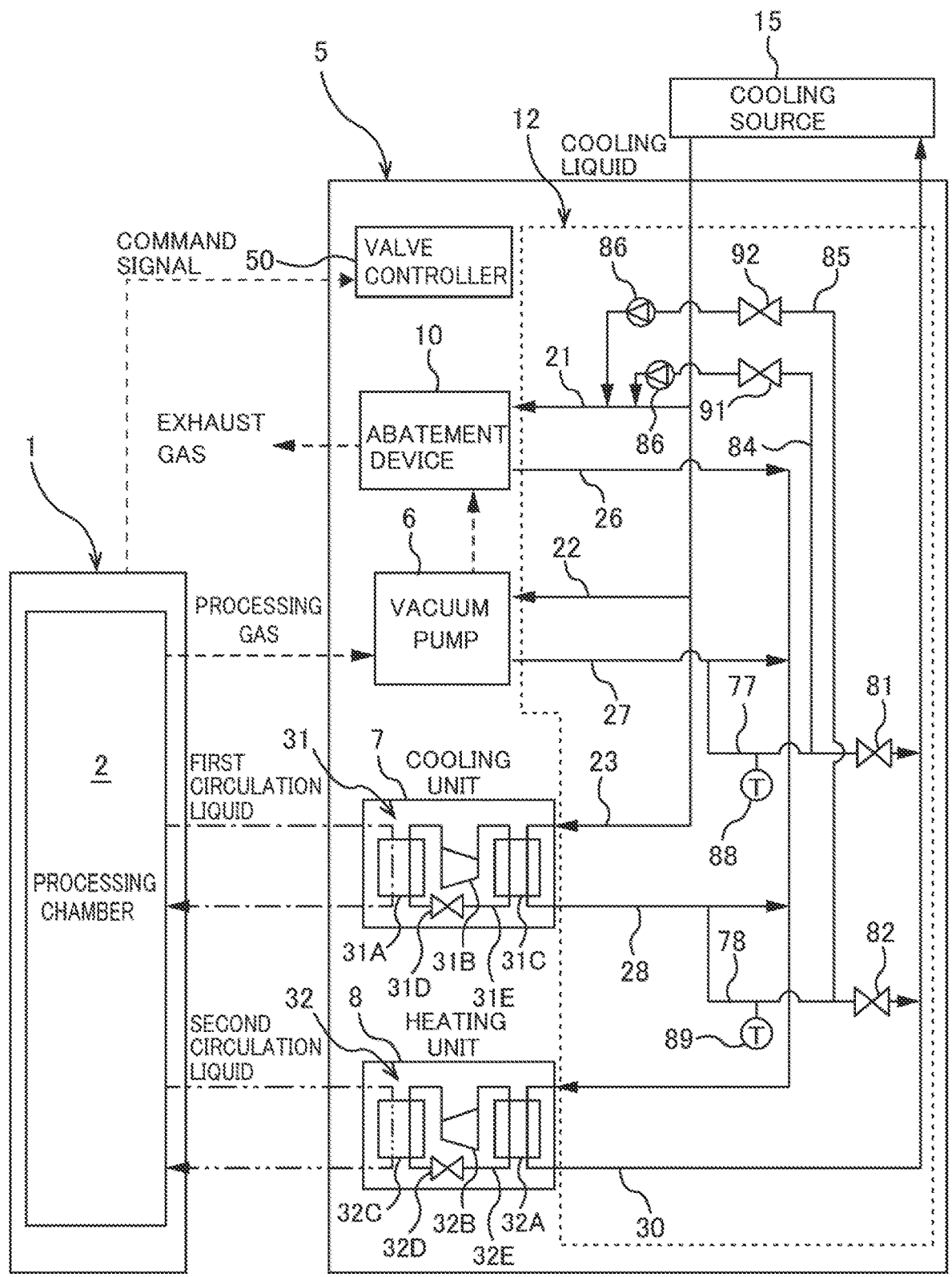
FIG. 16 is a schematic diagram showing still another embodiment of the sub-fab area installation apparatus.

FIG. 16 is a schematic diagram showing another embodiment of the sub-fab area installation apparatus 5. Configurations and operations of the present embodiment, which will not be particularly described, are the same as those of the embodiments described with reference to FIG. 15, and duplicated descriptions thereof will be omitted. The sub-fab area installation apparatus 5 of the present embodiment includes: a second return-line temperature measuring device 88 configured to measure the temperature of the cooling liquid flowing through the second return line 77 at a position upstream of the second return reheating line 84: second return flow-rate control valve 81 and third return flow-rate control valve 82 provided in the second return line 77 and the third return line 78, respectively; a third return-line temperature measuring device 89 configured to measure the temperature of the cooling liquid flowing through the third return line 78 at a position upstream of the third return reheating line 85; a second return reheating flow-rate control valve 91 and a third return reheating flow-rate control valve 92 provided in the second return reheating line 84 and the third return reheating line 85, respectively; and valve controller 50 configured to control the operations of the second return flow-rate control valve 81, the third return flow-rate control valve 82, the second return reheating flow-rate control valve 91, and the third return reheating flow-rate control valve 92.

The second return-line temperature measuring device 88, the third return-line temperature measuring device 89, the second return flow-rate control valve 81, the third return flow-rate control valve 82, the second return reheating flow-rate control valve 91, and the third return reheating flow-rate control valve 92 are electrically coupled to the valve controller 50. The valve controller 50 is configured to increase the opening degree of the second return flow-rate control valve 81 and reduce the opening degree of the second return reheating flow-rate control valve 91 when the temperature of the cooling liquid flowing through the second return line 77, measured by the second return-line temperature measuring device 88, is lower than a set value. The valve controller 50 is further configured to increase the opening degree of the third return flow-rate control valve 82 and reduce the opening degree of the third return reheating flow-rate control valve 92 when the temperature of the cooling liquid flowing through the third return line 78, measured by the third return-line temperature measuring device 89, is lower than a set value.

Reducing the opening degree of the second return reheating flow-rate control valve 91 includes completely closing the second return reheating flow-rate control valve 91 (i.e, reducing the opening degree to 0%). Reducing the opening degree of the third return reheating flow-rate control valve 92 includes completely closing the third return reheating flow-rate control valve 92 (i.e., reducing the opening degree to 0%). Similarly, increasing the opening degree of the second return flow-rate control valve 81 includes fully opening the second return flow-rate control valve 81 (i.e., increasing the opening degree to 100%). Increasing the opening degree of the third return flow-rate control valve 82 includes fully opening the third return flow-rate control valve 82 (i.e., increasing the opening degree to 100%).

According to the present embodiment, adjusting the flow rate of the control valve according to the temperature of the cooling liquid can make it possible to highly utilize the cooling source 15, such as a chiller, and the heating unit 8.

In one embodiment, the valve controller 50 may be configured to control the operations of the second return flow-rate control valve 81, the third return flow-rate control valve 82, the second return reheating flow-rate control valve 91, and the third return reheating flow-rate control valve 92 according to a command signal from the semiconductor manufacturing equipment 1. Also in this case, adjusting the flow rate of the control valve according to the temperature of the cooling liquid can make it possible to highly utilize the cooling source 15, such as a chiller, and the heating unit 8.

Figure 17:
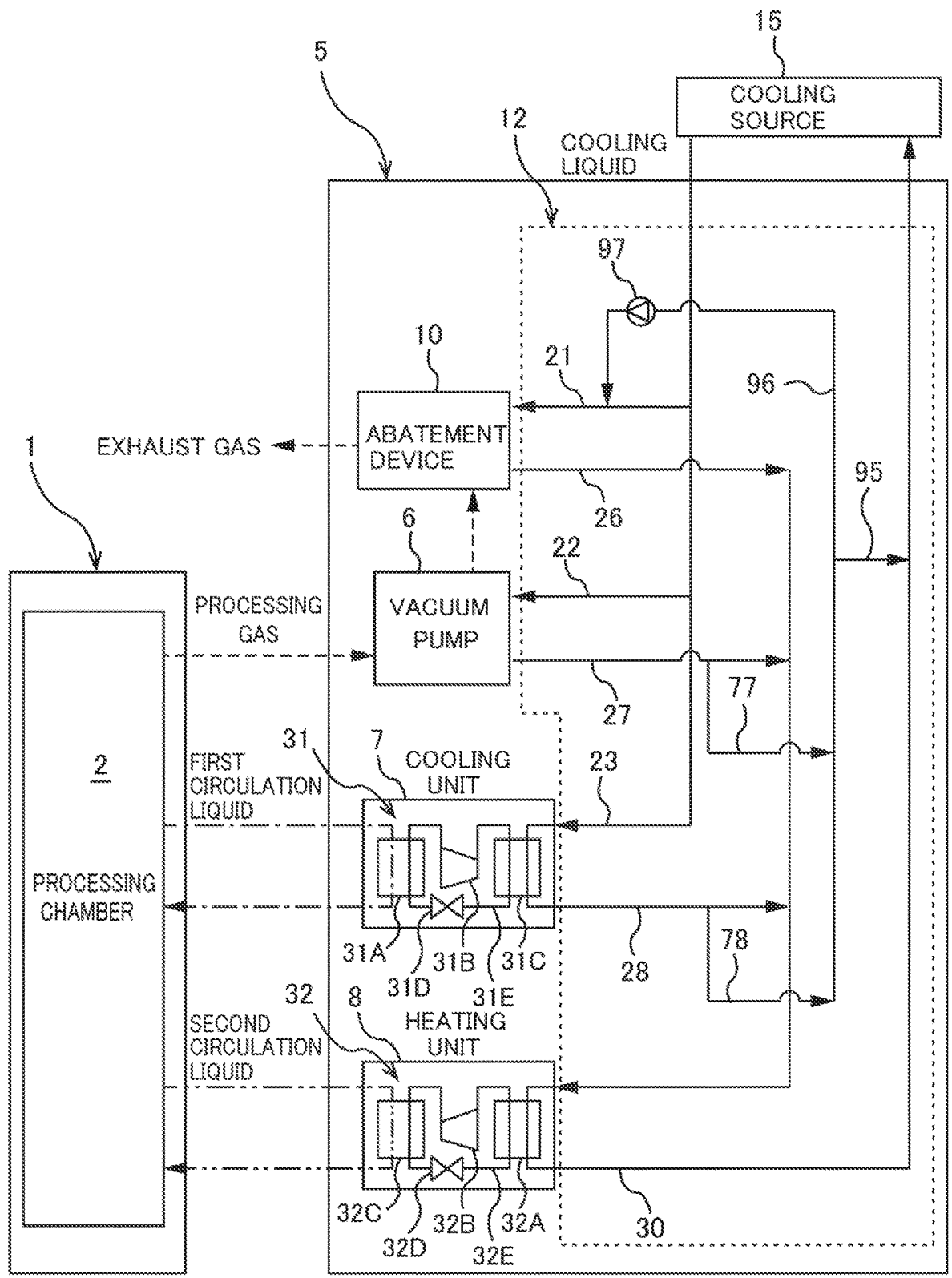
FIG. 17 is a schematic diagram showing still another embodiment of the sub-fab area installation apparatus.

FIG. 17 is a schematic diagram showing another embodiment of the sub-fab area installation apparatus 5. Configurations and operations of the present embodiment, which will not be particularly described, are the same as those of the embodiments described with reference to FIG. 12, and duplicated descriptions thereof will be omitted. The second return line 77 and the third return line 78 merge to form a merging return line 95. The merging return line 95 is coupled to the cooling-liquid return line 30. The cooling-liquid line 12 further includes a merging reheating line 96 branching off from the merging return line 95. The merging reheating line 96 is coupled to the first upstream line 21 via a pressurizing pump 97.

According to the present embodiment, when the cooling liquid that has passed through the vacuum pump 6 and the cooling unit 7 does not have a temperature high enough to serve as a driving heat source for heating the second circulation liquid flowing through the heating unit 8, the cooling liquid is returned to the cooling source 15, or returned to the abatement device 10 and can be heated again.

Figure 18:
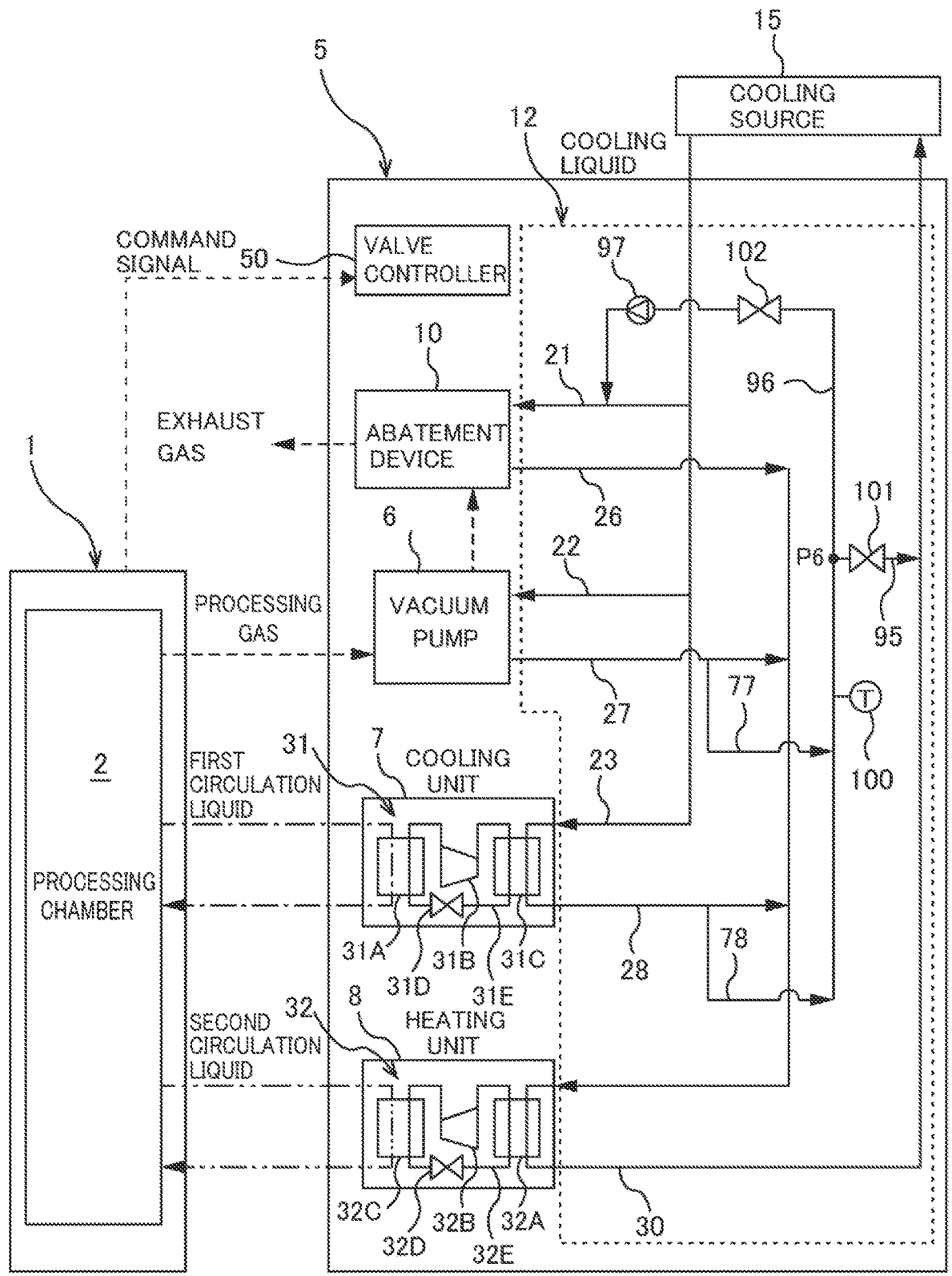
FIG. 18 is a schematic diagram showing still another embodiment of the sub-fab area installation apparatus.

FIG. 18 is a schematic diagram showing still another embodiment of the sub-fab area installation apparatus 5. Configurations and operations of the present embodiment, which will not be particularly described, are the same as those of the embodiments described with reference to FIG. 17, and duplicated descriptions thereof will be omitted. The sub-fab area installation apparatus 5 further includes: a merging return-temperature measuring device 100 configured to measure the temperature of the cooling liquid flowing through the merging return line 95; a merging return flow-rate control valve 101 provided in the merging return line 95 at a position downstream of a branch point P6 between the merging return line 95 and the merging reheating line 96; a merging reheating flow-rate control valve 102 provided in the merging reheating line 96; and valve controller 50 configured to control the operations of the merging return flow-rate control valve 101 and the merging reheating flow-rate control valve 102.

The merging return-temperature measuring device 100, the merging return flow-rate control valve 101, and the merging reheating flow-rate control valve 102 are electrically coupled to the valve controller 50. The valve controller 50 is configured to increase the opening degree of the merging return flow-rate control valve 101 and reduce the opening degree of the merging reheating flow-rate control valve 102 when the temperature of the cooling liquid flowing through the merging return line 95, measured by the merging return-temperature measuring device 100, is lower than a set value. Increasing the opening degree of the merging return flow-rate control valve 101 includes opening the merging return flow-rate control valve 101 (i.e., increasing the opening degree to 100%). Similarly, reducing the opening degree of the merging reheating flow-rate control valve 102 includes completely closing the merging reheating flow-rate control valve 102 (i.e., reducing the opening degree to 0%).

According to the present embodiment, adjusting the flow rate of the control valve according to the temperature of the cooling liquid can make it possible to highly utilize the cooling source 15, such as a chiller, and the heating unit 8. Further, by merging the return lines, the single temperature measuring device and the single flow-rate control valve can be provided.

In one embodiment, the valve controller 50 may be configured to control the operations of the merging return flow-rate control valve 101 and the merging reheating flow-rate control valve 102 according to a command signal from the semiconductor manufacturing equipment 1. Also in this case, adjusting the flow rate of the control valve according to the temperature of the cooling liquid can make it possible to highly utilize the cooling source 15, such as a chiller, and the heating unit 8.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A sub-fab area installation apparatus used for a semiconductor manufacturing equipment, comprising:
   a vacuum pump configured to evacuate a processing gas from a processing chamber of the semiconductor manufacturing equipment;
   a cooling unit configured to cool a first circulation liquid used in the processing chamber;
   a heating unit configured to heat a second circulation liquid used in the processing chamber;
   an abatement device configured to detoxify the processing gas discharged from the vacuum pump; and
   a cooling-liquid line configured to pass a cooling liquid therethrough, the cooling liquid being supplied from a cooling source,
   wherein the cooling unit includes a first heat pump through which a refrigerant circulates,
   the heating unit includes a second heat pump through which a refrigerant circulates, and
   the cooling-liquid line includes:
      a first upstream line, a second upstream line, and a third upstream line configured to supply the cooling liquid to the abatement device, the vacuum pump, and the cooling unit, respectively;
      a first downstream line, a second downstream line, and a third downstream line configured to supply the cooling liquid that has passed through the abatement device, the vacuum pump, and the cooling unit to the heating unit; and
      a cooling-liquid return line configured to return the cooling liquid that has passed through the heating unit to the cooling source.

2. The sub-fab area installation apparatus according to claim 1, wherein the first downstream line, the second downstream line, and the third downstream line merge to form a merging line that extends to the heating unit, and
   the cooling-liquid line further includes a bypass line branching off from the merging line and coupled to the cooling-liquid return line.

3. The sub-fab area installation apparatus according to claim 2, further comprising:
   a first flow-rate control valve, a second flow-rate control valve, and a third flow-rate control valve provided in the first upstream line or the first downstream line, the second upstream line or the second downstream line, and the third upstream line or the third downstream line, respectively;
   a first temperature-measuring device, a second temperature-measuring device, and a third temperature-measuring device configured to measure temperature of the cooling liquid flowing through the first downstream line, the second downstream line, and the third downstream line;
   a heating-unit flow-rate control valve provided in the merging line, or the cooling-liquid return line, or the bypass line;
   a heating-unit flow-rate measuring device configured to measure a flow rate of the cooling liquid flowing through the heating unit, the heating-unit flow-rate measuring device being provided in the merging line or the cooling-liquid return line; and
   a valve controller configured to control operations of the third flow-rate control valve, the second flow-rate control valve, and the third flow-rate control valve such that temperatures of the cooling liquid flowing through the first downstream line, the second downstream line, and the third downstream line are constant, the valve controller being further configured to control operation of the heating-unit flow-rate control valve such that the flow rate of the cooling liquid flowing through the heating unit is constant.

4. The sub-fab area installation apparatus according to claim 1, further comprising:
   a return-temperature measuring device configured to measure the temperature of the cooling liquid flowing through the cooling-liquid return line; and
   a heat pump controller configured to control operation of the second heat pump of the heating unit such that the temperature of the cooling liquid flowing through the cooling-liquid return line is maintained at not less than a set value.

5. The sub-fab area installation apparatus according to claim 1, further comprising a buffer tank coupled to the first downstream line, the second downstream line, and the third downstream line.

6. The sub-fab according to claim 5, wherein the first downstream line, the second downstream line, and the third downstream line merge to form a merging line that extends to the heating unit, and
   the cooling-liquid line further includes a reheating line branching off from the merging line, the reheating line extending from the merging line to the first upstream line.

7. The sub-fab area installation apparatus according to claim 6, wherein the cooling-liquid line further includes a bypass line branching off from the merging line and coupled to the cooling-liquid return line,
   the sub-fab area installation apparatus further comprises:
   an in-tank temperature measuring device configured to measure the temperature of the cooling liquid in the buffer tank;
   a reheating flow-rate control valve attached to the reheating line;
   a heating-unit flow-rate control valve provided in the bypass line, or the merging line, or the cooling-liquid return line; and
   a valve controller configured to control operations of the reheating flow-rate control valve and the heating-unit flow-rate control valve when the temperature of the cooling liquid in the buffer tank is equal to or lower than a set value such that the flow rate of the cooling liquid flowing through the reheating line has a predetermined value.

8. The sub-fab area installation apparatus according to claim 1, wherein the cooling-liquid line further includes a second reheating line branching off from the second downstream line and a third reheating line branching off from the third downstream line, the second reheating line and the third reheating line being coupled to the first upstream line via a pressurizing pump.

9. The sub-fab area installation apparatus according to claim 8, further comprising:
   a second downstream flow-rate control valve provided in the second downstream line at a position downstream of a branch point between the second downstream line and the second reheating line;
   a third downstream flow-rate control valve provided in the third downstream line at a position downstream of a branch point between the third downstream line and the third reheating line;

a second temperature-measuring device and a third temperature-measuring device configured to measure the temperature of the cooling liquid flowing through the second downstream line and the third downstream line;
a second reheating flow-rate control valve and a third reheating flow-rate control valve provided in the second reheating line and the third reheating line, respectively; and
a valve controller configured to:
reduce an opening degree of the second downstream flow-rate control valve and increase an opening degree of the second reheating flow-rate control valve when the temperature of the cooling liquid flowing through the second downstream line is lower than a threshold value; and
reduce an opening degree of the third downstream flow-rate control valve and increase an opening degree of the third reheating flow-rate control valve when the temperature of the cooling liquid flowing through the third downstream line is lower than a threshold value.

10. The sub-fab area installation apparatus according to claim 9, further comprising:
a first downstream flow-rate control valve provided in the first downstream line; and
a heating-unit flow-rate measuring device configured to measure the flow rate of the cooling liquid flowing through the heating unit,
wherein the valve controller is further configured to control operation of the first downstream flow-rate control valve such that the flow rate of the cooling liquid flowing through the heating unit is constant.

11. The sub-fab area installation apparatus according to claim 1, wherein the cooling-liquid line further includes a second return line branching off from the second downstream line and a third return line branching off from the third downstream line, the second return line and the third return line being coupled to the cooling-liquid return line.

12. The sub-fab area installation apparatus according to claim 11, further comprising:
a first downstream flow-rate control valve provided in the first downstream line;
a second downstream flow-rate control valve provided in the second downstream line at a position downstream of a branch point between the second downstream line and the second return line;
a third downstream flow-rate control valve provided in the third downstream line at a position downstream of a branch point between the third downstream line and the third return line;
a second temperature-measuring device and a third temperature-measuring device configured to measure the temperature of the cooling liquid flowing through the second downstream line and the third downstream line;
a second return flow-rate control valve and a third return flow-rate control valve provided in the second return line and the third return line, respectively;
a heating-unit flow-rate measuring device configured to measure the flow rate of the cooling liquid flowing through the heating unit; and
a valve controller configured to:
reduce an opening degree of the second downstream flow-rate control valve and increase an opening degree of the second return flow-rate control valve when the temperature of the cooling liquid flowing through the second downstream line is lower than a threshold value;
reduce an opening degree of the third downstream flow-rate control valve and increase an opening degree of the third return flow-rate control valve when the temperature of the cooling liquid flowing through the third downstream line is lower than a threshold value; and
control operation of the first downstream flow-rate control valve such that the flow rate of the cooling liquid flowing through the heating unit is constant.

13. The sub-fab area installation apparatus according to claim 11, wherein the first downstream line, the second downstream line, and the third downstream line merge to form a merging line that extends to the heating unit,
the cooling-liquid line further includes a bypass line branching off from the merging line and coupled to the cooling-liquid return line,
the sub-fab area installation apparatus further comprises:
a second downstream flow-rate control valve provided in the second downstream line at a position downstream of a branch point between the second downstream line and the second return line;
a third downstream flow-rate control valve provided in the third downstream line at a position downstream of a branch point between the third downstream line and the third return line;
a second temperature-measuring device and a third temperature-measuring device configured to measure the temperature of the cooling liquid flowing through the second downstream line and the third downstream line;
a second return flow-rate control valve and a third return flow-rate control valve provided in the second return line and the third return line, respectively;
a heating-unit flow-rate measuring device configured to measure the flow rate of the cooling liquid flowing through the heating unit;
a heating-unit flow-rate control valve provided in the merging line, the cooling-liquid return line, or the bypass line; and
a valve controller configured to:
reduce an opening degree of the second downstream flow-rate control valve and increase an opening degree of the second return flow-rate control valve when the temperature of the cooling liquid flowing through the second downstream line is lower than a threshold value;
reduce an opening degree of the third downstream flow-rate control valve and increase an opening degree of the third return flow-rate control valve when the temperature of the cooling liquid flowing through the third downstream line is lower than a threshold value; and
control operation of the heating-unit flow-rate control valve such that the flow rate of the cooling liquid flowing through the heating unit is constant.

14. The sub-fab area installation apparatus according to claim 11, wherein the cooling-liquid line further includes a second return reheating line branching off from the second return line and a third return reheating line branching off from the third return line, the second return reheating line and the third return reheating line being coupled to the first upstream line via a pressurizing pump.

15. The sub-fab area installation apparatus according to claim 14, further comprising:
a second return-line temperature measuring device configured to measure the temperature of the cooling liquid flowing through the second return line at a position upstream of the second return reheating line;

a second return flow-rate control valve and a third return flow-rate control valve provided in the second return line and the third return line, respectively;

a third return-line temperature measuring device configured to measure the temperature of the cooling liquid flowing through the third return line at a position upstream of the third return reheating line;

a second return reheating flow-rate control valve and a third return reheating flow-rate control valve provided in the second return reheating line and the third return reheating line, respectively; and a valve controller configured to control operations of the second return flow-rate control valve, the third return flow-rate control valve, the second return reheating flow-rate control valve, and the third return reheating flow-rate control valve.

16. The sub-fab area installation apparatus according to claim 15, wherein the valve controller is configured to:

increase an opening degree of the second return flow-rate control valve and reduce an opening degree of the second return reheating flow-rate control valve when the temperature of the cooling liquid flowing through the second downstream line is lower than a threshold value; and increase an opening degree of the third return flow-rate control valve and reduce an opening degree of the third return reheating flow-rate control valve when the temperature of the cooling liquid flowing through the third downstream line is lower than a threshold value.

17. The sub-fab area installation apparatus according to claim 15, wherein the valve controller is configured to control the operations of the second return flow-rate control valve, the third return flow-rate control valve, the second return reheating flow-rate control valve, and the third return reheating flow-rate control valve according to a command signal from the semiconductor manufacturing equipment.

18. The sub-fab area installation apparatus according to claim 11, wherein the second return line and the third return line merge to form a merging return line, the merging return line is coupled to the cooling-liquid return line, the cooling-liquid line further includes a merging reheating line branching off from the merging return line, and the merging reheating line is coupled to the first upstream line via a pressurizing pump.

19. The sub-fab area installation apparatus according to claim 18, further comprising:

a merging return-temperature measuring device configured to measure the temperature of the cooling liquid flowing through the merging return fine;

a merging return flow-rate control valve provided in the merging return line at a position downstream of a branch point of the merging reheating line from the merging return line;

a merging reheating flow-rate control valve provided in the merging reheating line; and a valve controller configured to control operations of the merging return flow-rate control valve and the merging reheating flow-rate control valve.

20. The sub-fab area installation apparatus according to claim 19, wherein the valve controller is configured to increase an opening degree of the merging return flow-rate control valve and reduce an opening degree of the merging reheating flow-rate control valve when the temperature of the cooling liquid flowing through the merging return line is lower than a set value.

21. The sub-fab area installation apparatus according to claim 19, wherein the valve controller is configured to control the operations of the merging return flow-rate control valve and the merging reheating flow-rate control valve according to a command signal from the semiconductor manufacturing equipment.

* * * * *